US011497136B2

(12) United States Patent
Badihi et al.

(10) Patent No.: US 11,497,136 B2
(45) Date of Patent: Nov. 8, 2022

(54) UNIVERSAL REPLACEABLE FAN UNIT FOR DATACENTERS

(71) Applicant: Mellanox Technologies, Ltd., Yokneam (IL)

(72) Inventors: Avner Badihi, Nataf (IL); Eyal Babish, Zichron Yaakov (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 641 days.

(21) Appl. No.: 16/502,686

(22) Filed: Jul. 3, 2019

(65) Prior Publication Data
US 2021/0007240 A1 Jan. 7, 2021

(51) Int. Cl.
*H05K 7/20* (2006.01)
*H05K 7/10* (2006.01)

(52) U.S. Cl.
CPC ....... *H05K 7/20172* (2013.01); *H05K 7/1084* (2013.01); *H05K 7/20727* (2013.01)

(58) Field of Classification Search
CPC .................................................. F04D 19/005
See application file for complete search history.

(56) References Cited

U.S. PATENT DOCUMENTS

| | | | | |
|---|---|---|---|---|
| 6,587,342 B1 * | 7/2003 | Hsu | ........................... | G06F 1/20 415/213.1 |
| 6,795,314 B1 * | 9/2004 | Arbogast | ........... | H05K 7/20172 165/122 |
| 7,048,498 B2 * | 5/2006 | Kosugi | ................. | F04D 29/663 415/214.1 |
| 7,434,743 B2 * | 10/2008 | Barsun | ............... | H05K 7/20727 165/80.3 |
| 7,824,155 B2 * | 11/2010 | Chen | ..................... | F04D 29/601 415/213.1 |
| 7,983,039 B1 * | 7/2011 | Nguyen | ............. | H05K 7/20727 361/695 |
| 8,068,340 B1 * | 11/2011 | Nguyen | ............... | F04D 25/0613 174/547 |
| 8,385,064 B1 * | 2/2013 | Smith | ................ | H05K 7/20727 361/679.48 |
| 8,390,998 B2 * | 3/2013 | Kliewer | .................... | G06F 1/20 361/679.48 |
| 8,687,365 B2 * | 4/2014 | Aruga | ................ | H05K 7/20736 361/679.48 |

(Continued)

*Primary Examiner* — Topaz L. Elliott
(74) *Attorney, Agent, or Firm* — Moore & Van Allen PLLC

(57) ABSTRACT

A universal replaceable fan unit and method of reversing an airflow direction of a universal replaceable fan unit is provided. The universal replaceable fan unit includes a fan assembly designed to create an airflow from an intake end to an output end. The universal replaceable fan unit also includes a fan mounting that receives and secures the fan assembly in an operable position. The fan mounting includes a frame member and a securing member. The fan mounting is designed to allow the fan assembly to be moved between a first position defining a first airflow direction and a second position defining a second airflow direction. The first airflow direction is opposite the second airflow direction. The universal replaceable fan unit further includes an electrical connector removably attached to the fan assembly. The electrical connector allows electricity to be provided to the fan assembly for operation.

20 Claims, 16 Drawing Sheets

(56) References Cited

U.S. PATENT DOCUMENTS

| | | | | |
|---|---|---|---|---|
| 9,357,680 | B2* | 5/2016 | Aruga | H05K 7/20736 |
| 2003/0163905 | A1* | 9/2003 | Rubenstein | H05K 7/20172 |
| | | | | 24/453 |
| 2004/0190246 | A1* | 9/2004 | Arbogast | H05K 7/20172 |
| | | | | 361/695 |
| 2012/0044645 | A1* | 2/2012 | Aruga | H05K 7/20727 |
| | | | | 361/695 |
| 2012/0120601 | A1* | 5/2012 | Tang | H05K 7/20172 |
| | | | | 415/213.1 |
| 2012/0140406 | A1* | 6/2012 | Kliewer | G06F 1/20 |
| | | | | 361/679.48 |
| 2014/0152446 | A1* | 6/2014 | Aruga | H05K 7/20736 |
| | | | | 340/603 |
| 2014/0211418 | A1* | 7/2014 | Arreola | H05K 7/20172 |
| | | | | 361/695 |
| 2016/0146212 | A1* | 5/2016 | Cananzi | F04D 25/06 |
| | | | | 417/44.1 |
| 2016/0174409 | A1* | 6/2016 | Mease | H05K 7/20172 |
| | | | | 361/695 |
| 2018/0100512 | A1* | 4/2018 | Chen | F04D 25/08 |
| 2021/0025401 | A1* | 1/2021 | Shih | F04D 25/0693 |
| 2021/0282296 | A1* | 9/2021 | Shabtay | F04D 29/601 |

* cited by examiner

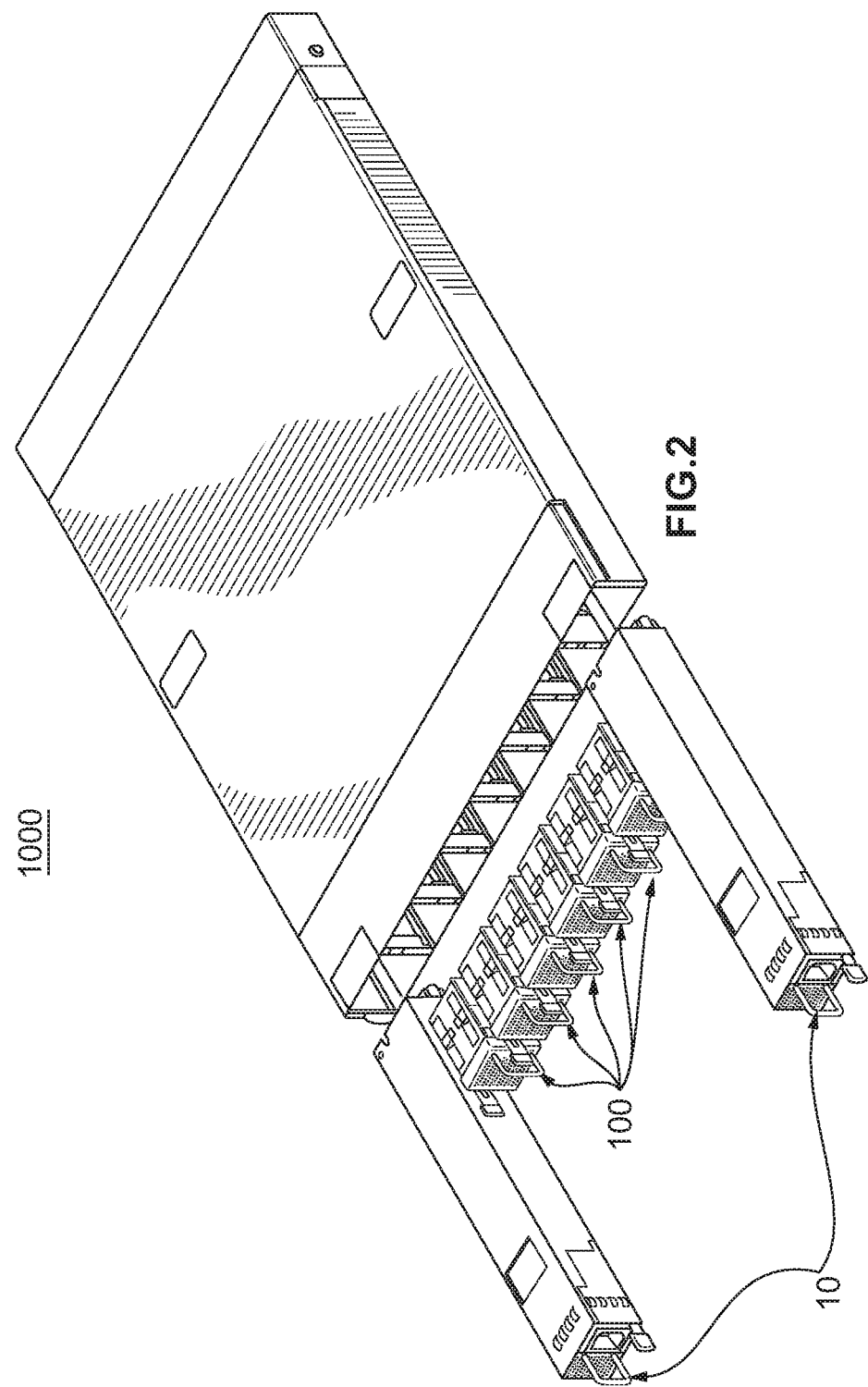

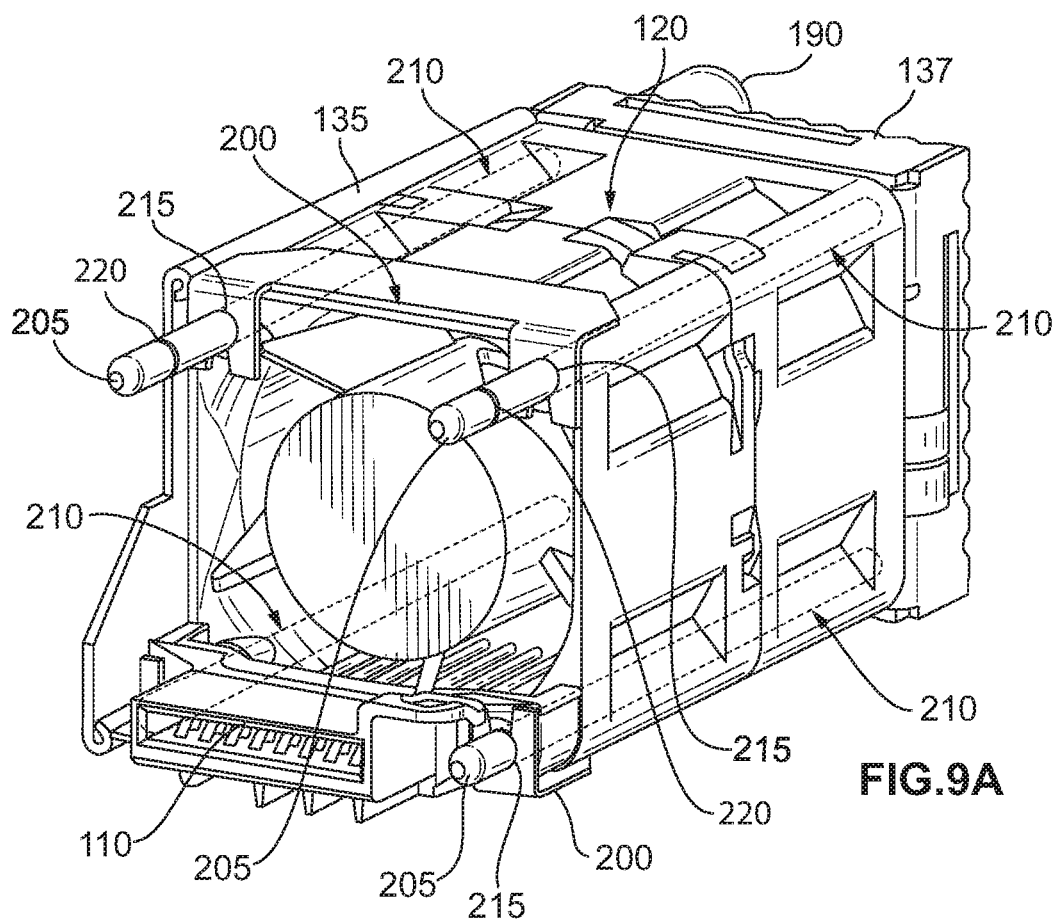
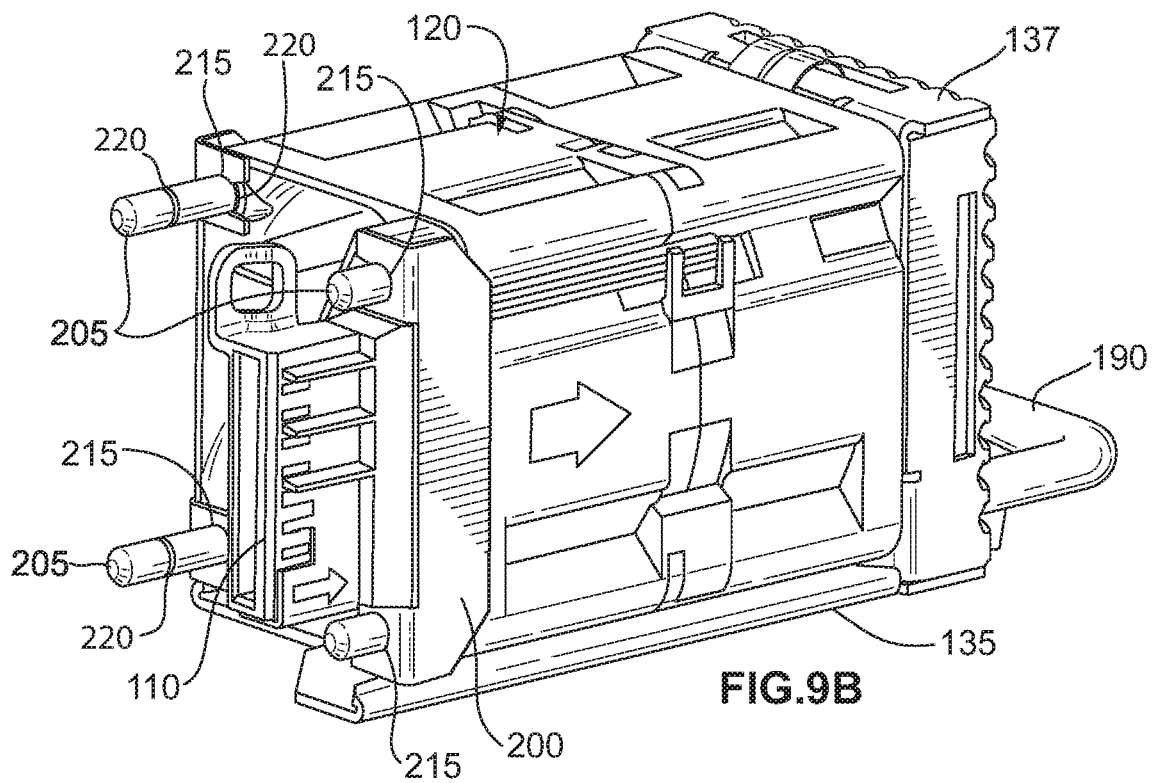

UNIVERSAL REPLACEABLE FAN UNIT FOR DATACENTERS

TECHNOLOGICAL FIELD

The present disclosure relates in general to replaceable fan units for use in datacenter switch systems and routers. In particular, universal replaceable fan units for use in datacenter switch systems and routers are described herein.

BACKGROUND

Datacenter switch systems and routers often have components that generate heat during operation. Generally, the heat can be detrimental to component performance, necessitating cooling in order to maintain efficient operations. Various switch systems and routers implement replaceable fan units designed to maintain the temperature below a given threshold during operation. The fan units may be configured to be replaceable. Often, switch systems and routers are configured such that the fan units may be installed and uninstalled without requiring the switch system or router to be opened.

BRIEF SUMMARY

The following presents a simplified summary in order to provide a basic understanding of some aspects of the present disclosure. This summary is not an extensive overview and is intended to neither identify key or critical elements nor delineate the scope of such elements. Its purpose is to present some concepts of the described features in a simplified form as a prelude to the more detailed description that is presented later.

In an example embodiment, a universal replaceable fan unit is provided for cooling. The universal replaceable fan unit includes a fan assembly. The fan assembly includes an intake end and an output end and is configured to create an airflow from the intake end to the output end. The universal replaceable fan unit also includes a fan mounting configured to receive and secure the fan assembly in an operable position. The fan mounting includes a frame member and a securing member. The fan mounting is configured to allow the fan assembly to be moved with respect to the fan mounting between a first position defining a first airflow direction and a second position defining a second airflow direction. The first airflow direction is opposite the second airflow direction. The universal replaceable fan unit also includes an electrical connector removably attached to the fan assembly. The electrical connector is configured to allow electricity to be provided to the fan assembly for operation.

In some embodiments, the frame member defines a first edge and a second edge and the securing member includes a first clipping mechanism and a second clipping mechanism. In such embodiments, the first clipping mechanism is attached at a first clip attachment end to the first edge of the frame member and the second clipping mechanism is attached at a second clip attachment end to the second edge of the frame member. Additionally, in such embodiments, the first clipping mechanism is engagable with a first recess of the fan assembly at a first clip engaging end and the second clipping mechanism is engagable with a second recess of the fan assembly at a second clip engaging end. In some embodiments, the fan assembly is removably attached to the frame member in an instance in which the first clipping mechanism is engaged with the first recess and the second clipping mechanism is engaged with the second recess. In some embodiments, the frame member includes a base plate and the first edge of the frame member is an edge of the base plate and the second edge of the frame member is an edge of the base plate opposite the first edge. In some embodiments, the frame member includes a base plate and an end plate, and the first edge of the frame member is an edge of the base plate and the second edge of the frame member is an edge of the end plate. In some embodiments, at least one of the first clipping mechanism or the second clipping mechanism is hingedly attached to the frame member.

In some embodiments, the fan assembly includes a plurality of fastening channels, the securing member includes one or more nuts, and the frame member includes an end plate and a plurality of pins attached to the end plate at one end of each respective pin and the plurality of pins are configured to removably engage with the plurality of fastening channels and with the one or more nuts. In some embodiments, the one or more nuts are configured to restrict movement of the fan assembly with respect to the fan mounting when the plurality of pins are engaged with the plurality of fastening channels.

In some embodiments, the fan assembly includes a plurality of fastening channels, the securing member includes one or more securing plates, and the frame member includes an end plate and a plurality of pins attached to the end plate at one end of each respective pin and the plurality of pins are configured to removably engage with the plurality of fastening channels and with the one or more securing plates. In some embodiments, the one or more securing plates are configured to restrict movement of the fan assembly with respect to the fan mounting when the plurality of pins are engaged with the plurality of fastening channels.

In some embodiments, the fan mounting also includes a handle at an exterior end of the fan mounting, such that the universal replaceable fan unit can be removed from the switch system box via the handle. In some embodiments, the securing member is configured to restrict the movement of the fan assembly with respect to the fan mounting when engaged with the fan assembly.

In another example embodiment, a method of reversing an airflow direction of a universal replaceable fan unit for cooling is provided. The method includes providing a fan assembly comprising an intake end and an output end. The fan assembly is configured to create an airflow from the intake end to the output end. The method also includes moving the fan assembly between a first position in a fan mounting defining a first airflow direction and a second position in the fan mounting defining a second airflow direction. The first airflow direction is opposite the second airflow direction and the fan mounting includes a frame member and a securing member. The method further includes securing the fan assembly to the fan mounting via the securing member and attaching an electrical connector to the fan assembly, wherein the electrical connector is configured to allow electricity to be provided to the fan assembly for operation.

In some embodiments, the frame member includes a first edge and a second edge, and the securing member includes a first clipping mechanism and a second clipping mechanism. In such embodiments, the first clipping mechanism is attached at a first clip attachment end to the first edge of the frame member and the second clipping mechanism is attached at a second clip attachment end to the second edge of the frame member. In such embodiments, the method also includes engaging the first clipping mechanism with a first recess of the fan assembly at a first clip engaging end and engaging the second clipping mechanism with a second recess of the fan assembly at a second clip engaging end, such that the fan assembly is removably attached to the frame member in an instance in which the first clipping mechanism is engaged with the first recess and the second clipping mechanism is engaged with the second recess.

In some embodiments, the frame member includes a base plate, such that the first edge of the frame member is an edge of the base plate and the second edge of the frame member is an edge of the base plate opposite the first edge. In some embodiments, the frame member includes a base plate and an end plate, such that the first edge of the frame member is an edge of the base plate and the second edge of the frame member is an edge of the end plate. In some embodiments, at least one of the first clipping mechanism or the second clipping mechanism is hingedly attached to the frame member.

In some embodiments, the fan assembly includes a plurality of fastening channels, the securing member includes a one or more nuts, and the frame member includes an end plate and a plurality of pins attached to the end plate at one end of each respective pin. In such embodiments, the method also includes engaging the plurality of pins with the plurality of fastening channels and engaging the plurality of pins with the one or more nuts. In some embodiments, the one or more nuts are configured to restrict movement of the fan assembly with respect to the fan mounting when the plurality of pins are engaged with the plurality of fastening channels.

In some embodiments, the fan assembly includes a plurality of fastening channels, the securing member includes a one or more securing plates, and the frame member includes an end plate and a plurality of pins attached to the end plate at one end of each respective pin. In such embodiments, the method also includes engaging the plurality of pins with the plurality of fastening channels and engaging the plurality of pins with the one or more securing plates. In some embodiments, the one or more securing plates are configured to restrict movement of the fan assembly with respect to the fan mounting when the plurality of pins are engaged with the plurality of fastening channels.

In some embodiments, the fan mounting also includes a handle at an exterior end of the fan mounting, such that the universal replaceable fan unit can be removed from the switch system box via the handle. In some embodiments, the securing member is configured to restrict the movement of the fan assembly with respect to the fan mounting when engaged with the fan assembly.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Figure 1:
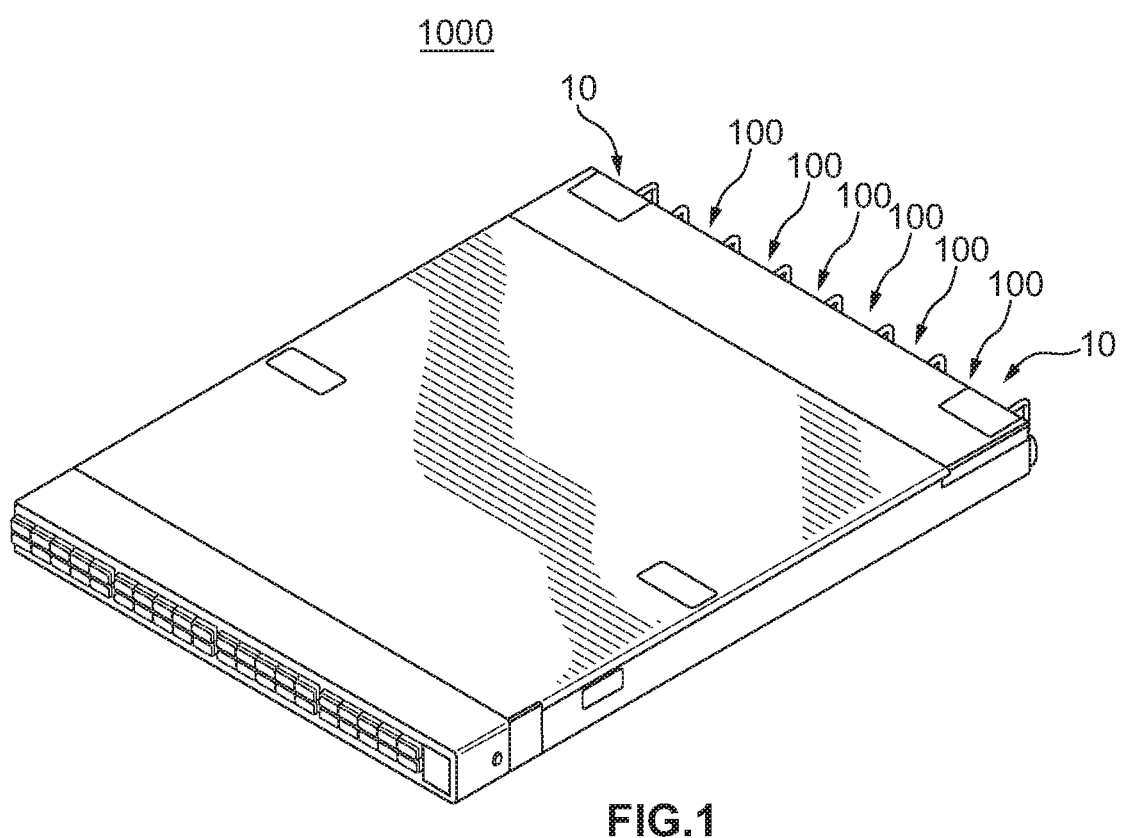
Figure 3A:
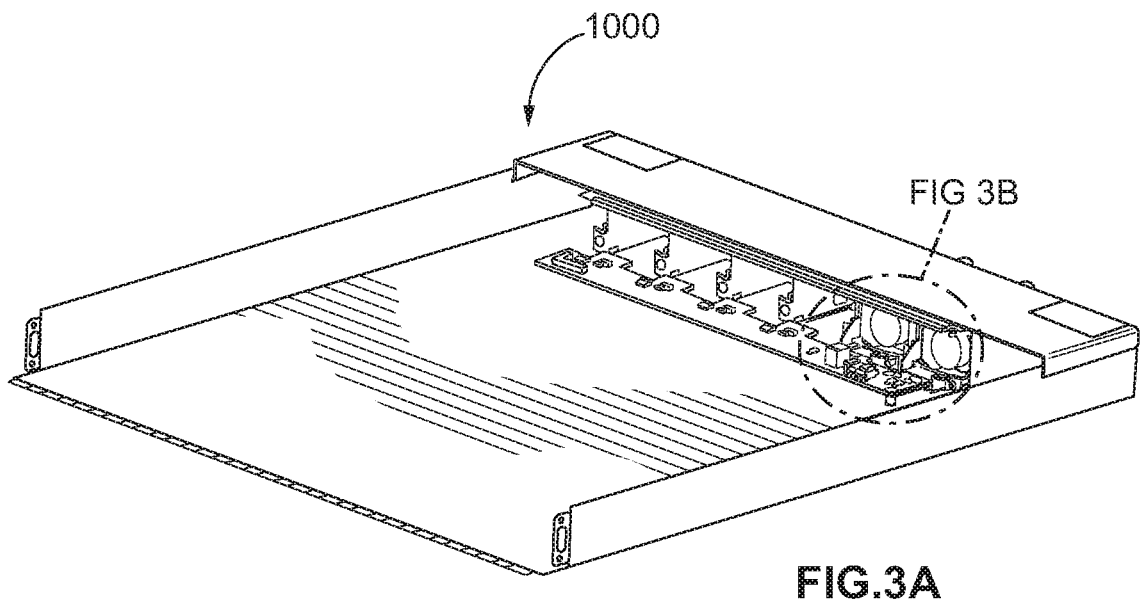
Figure 3B:
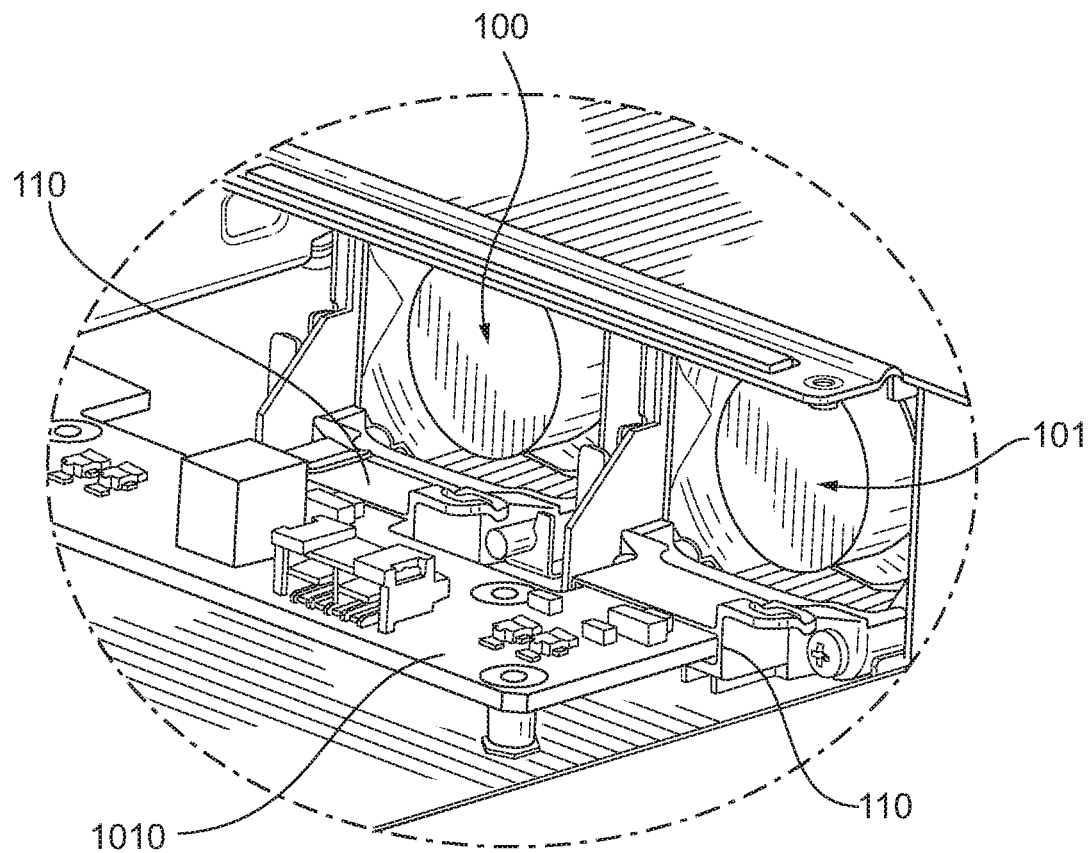
Figure 4A:
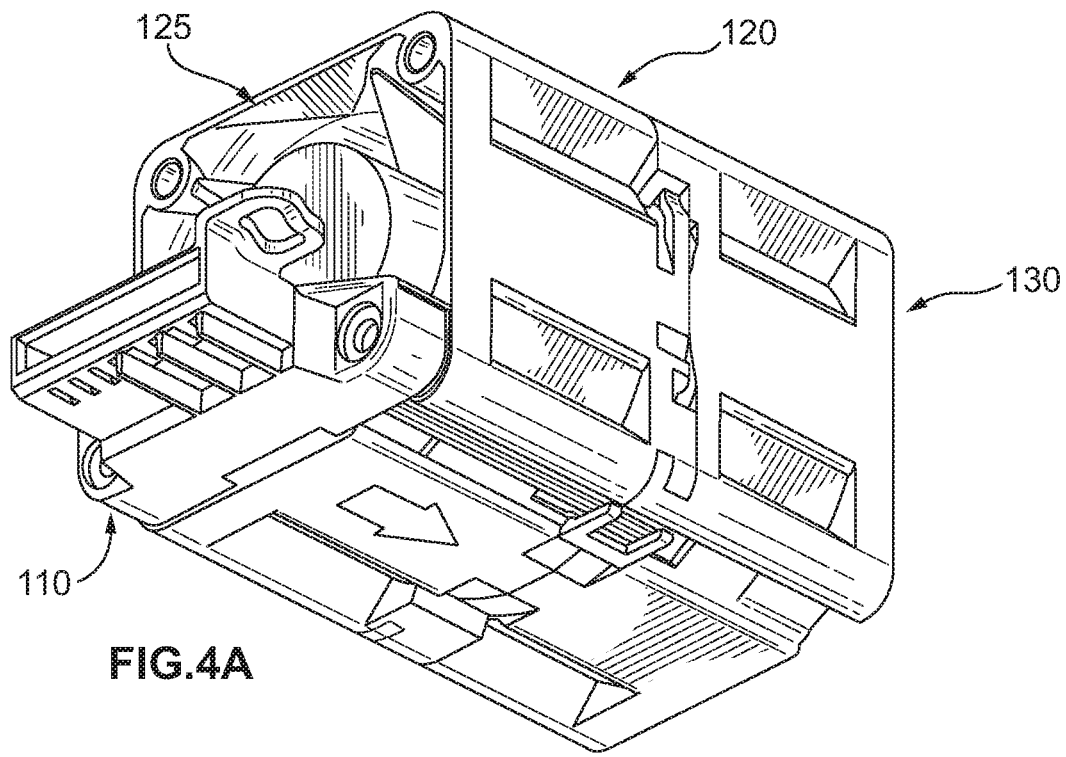
Figure 4B:
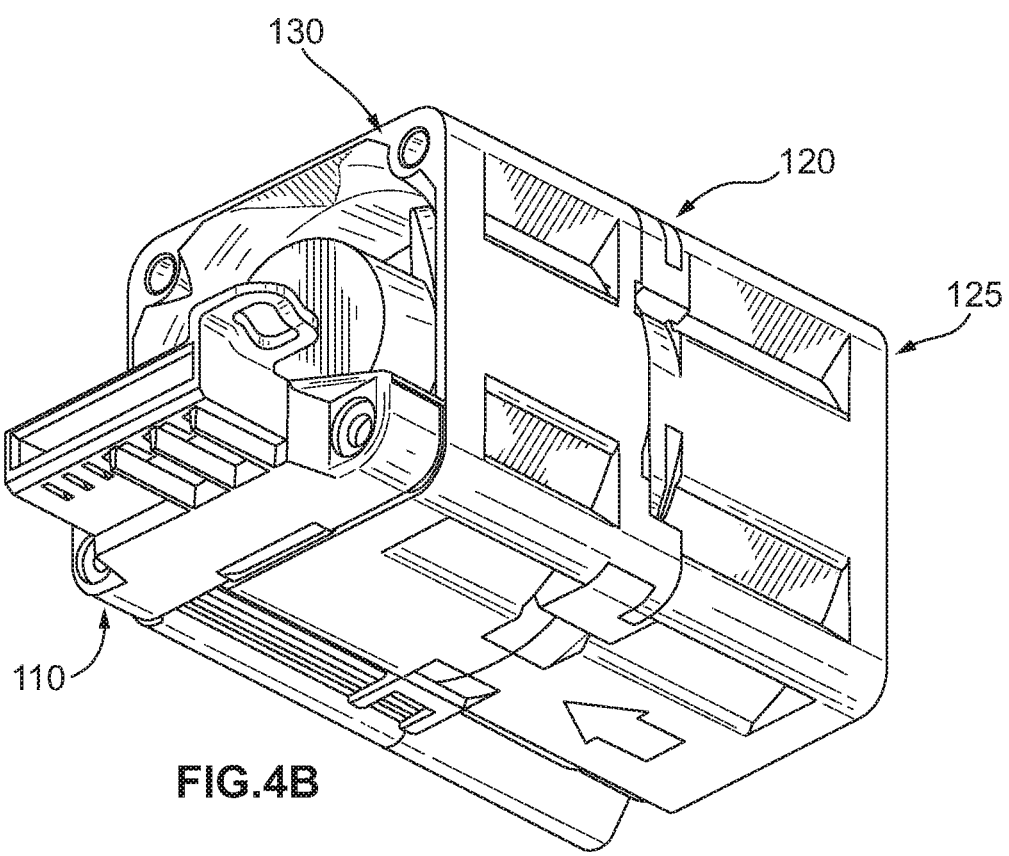
Figure 5A:
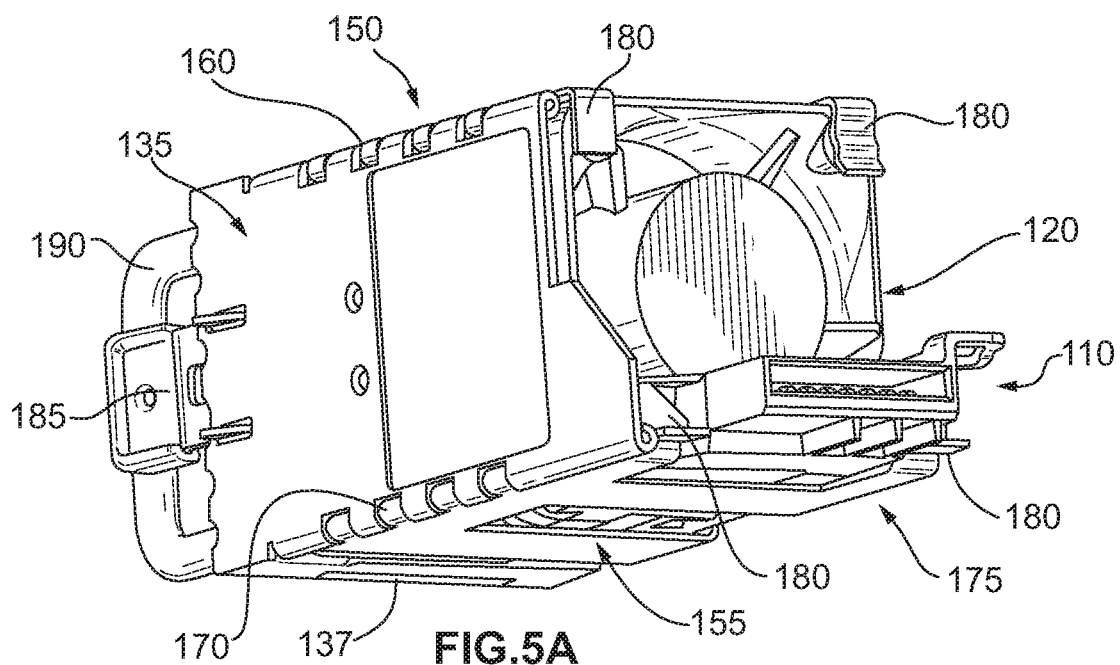
Figure 5B:
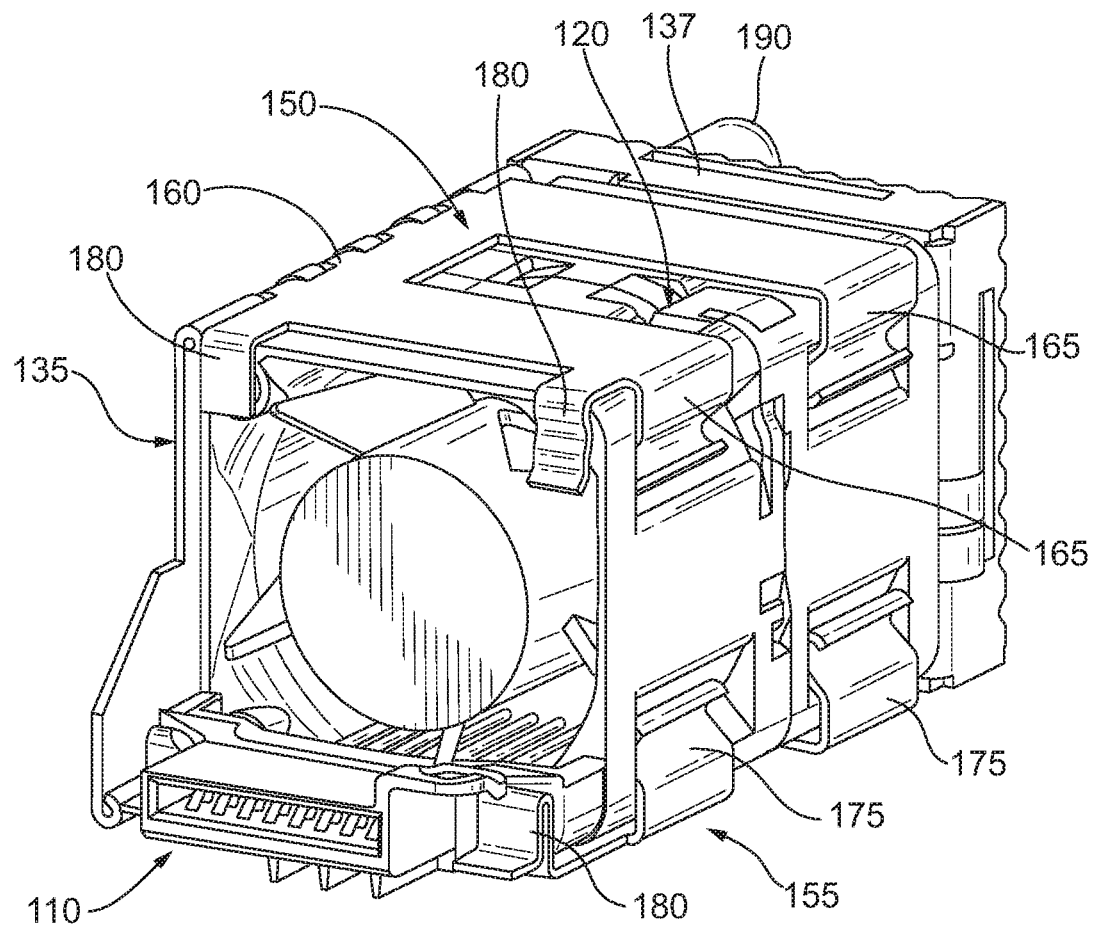
Figure 6:
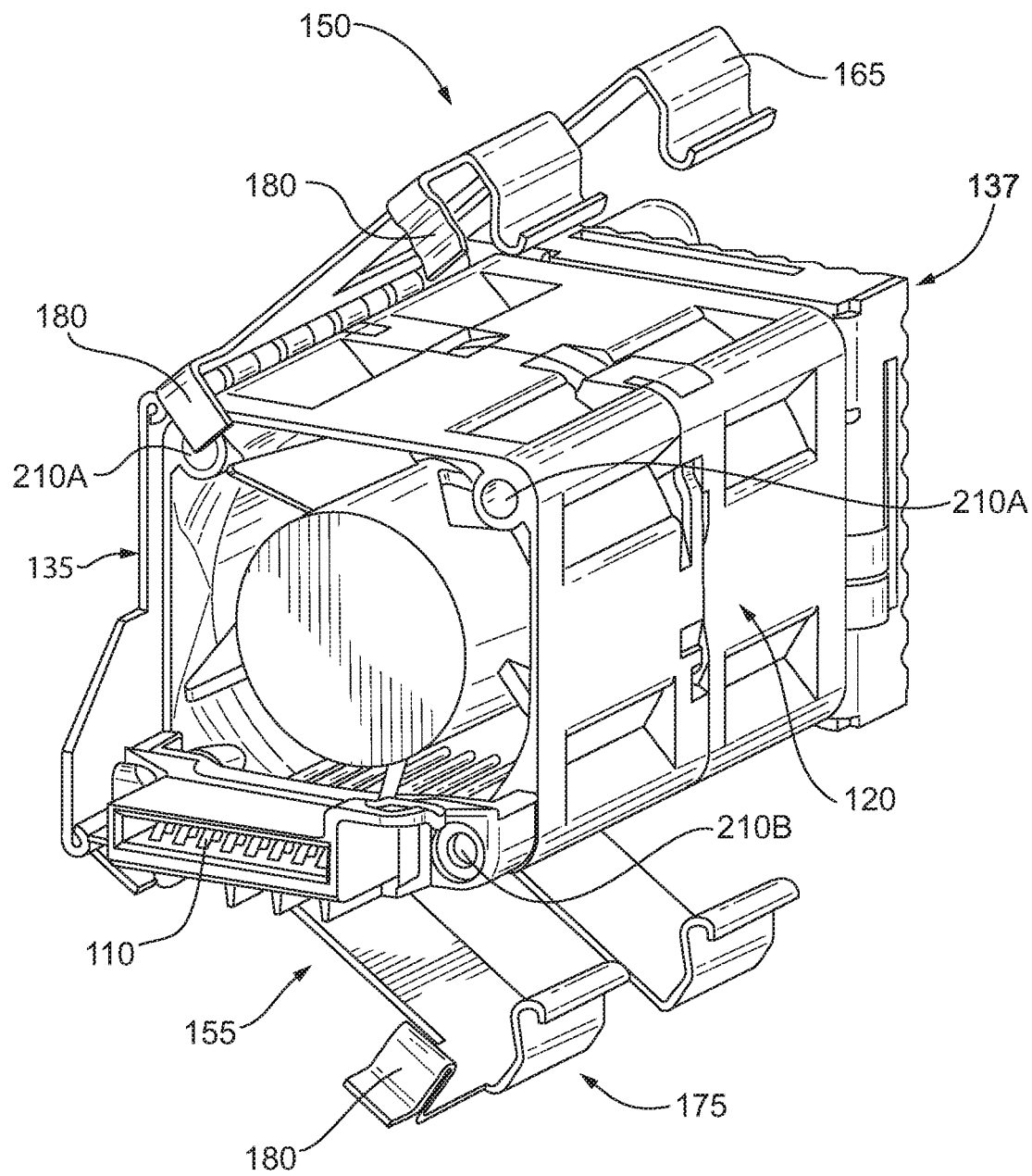
Figure 7A:
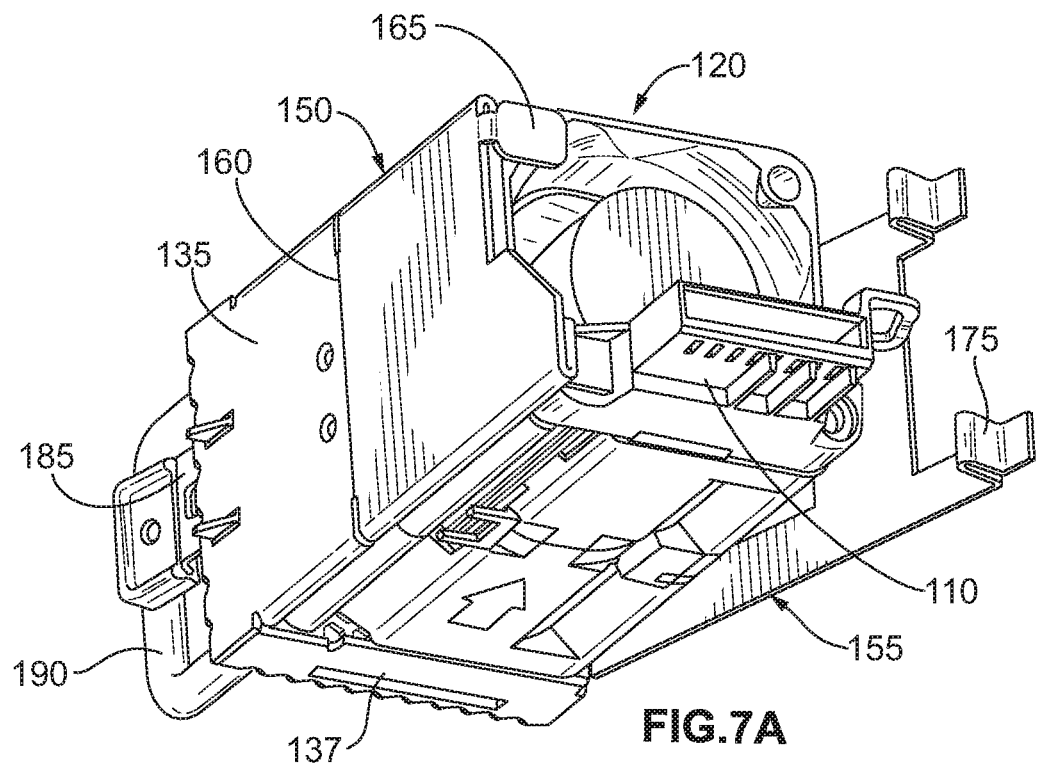
Figure 7B:
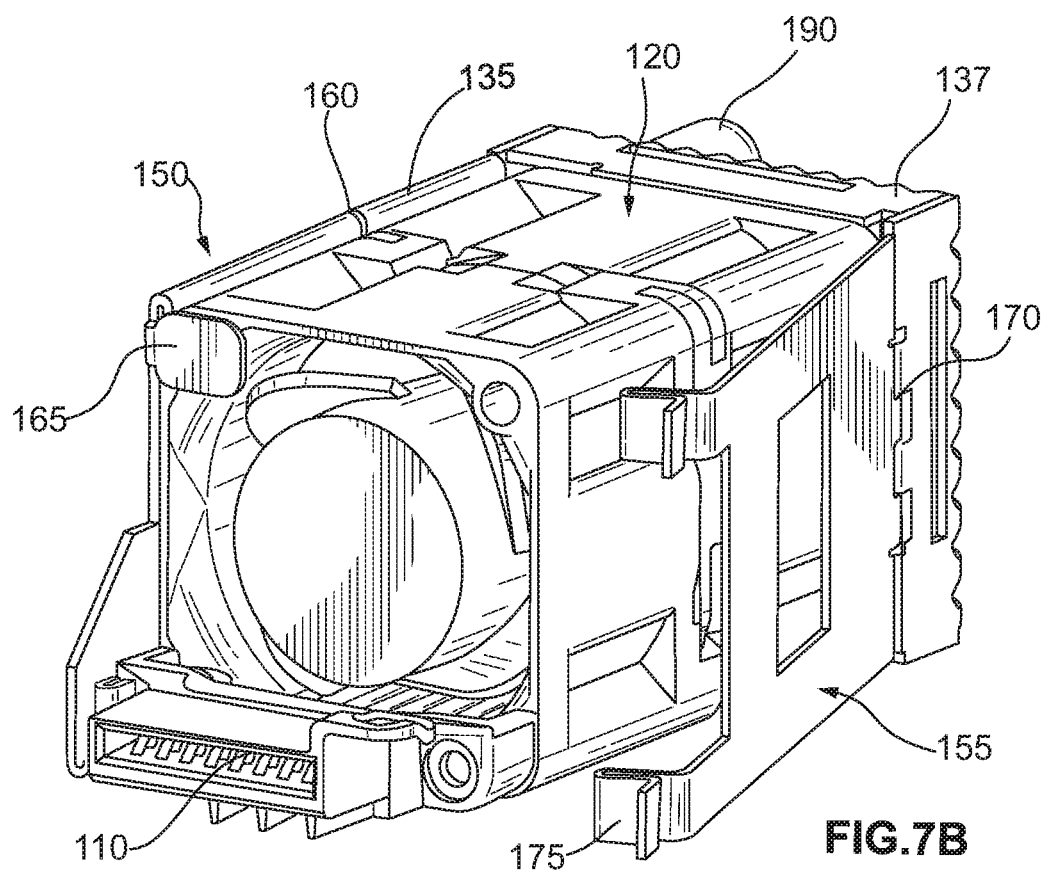
Figure 8:
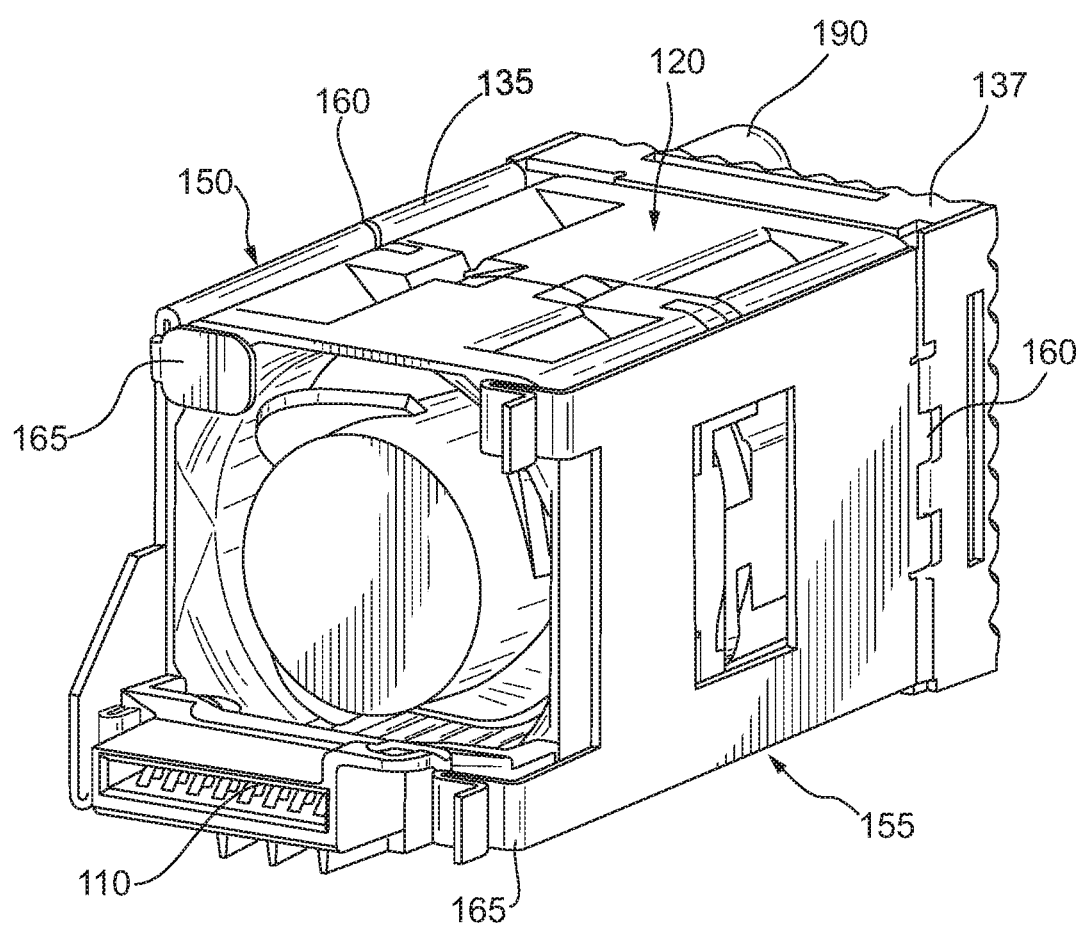
Figure 9C:
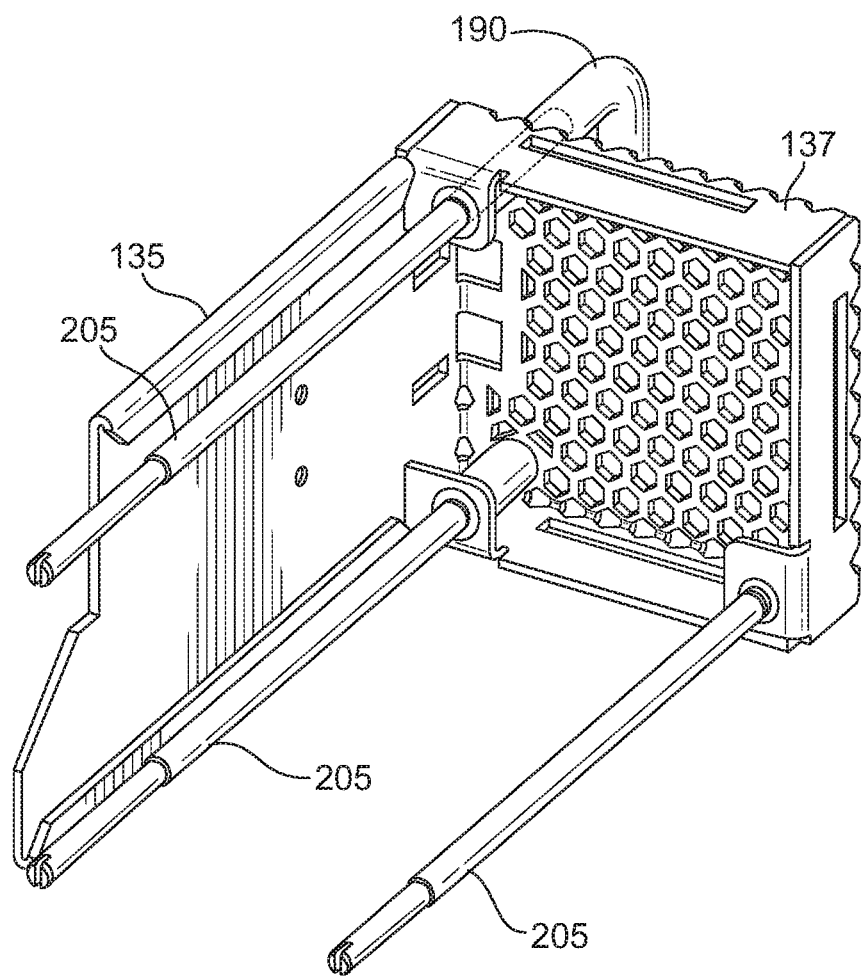
Figure 10:
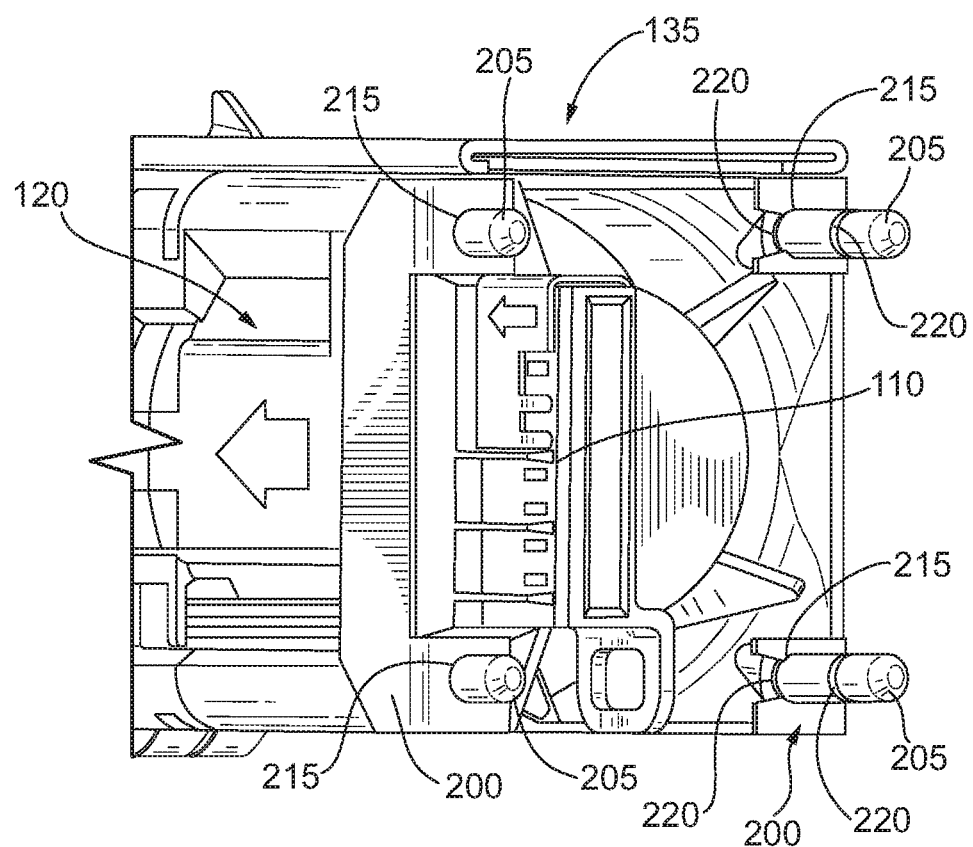
Figure 11A:
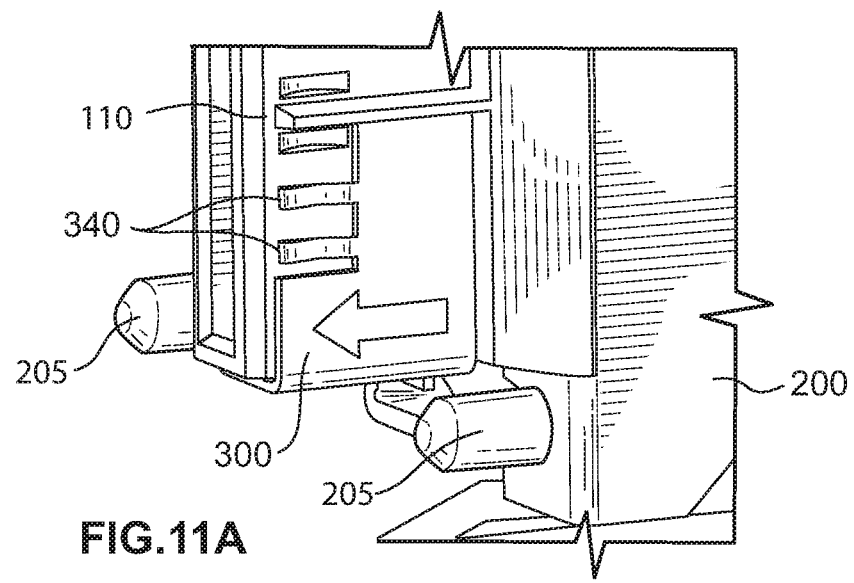
Figure 11B:
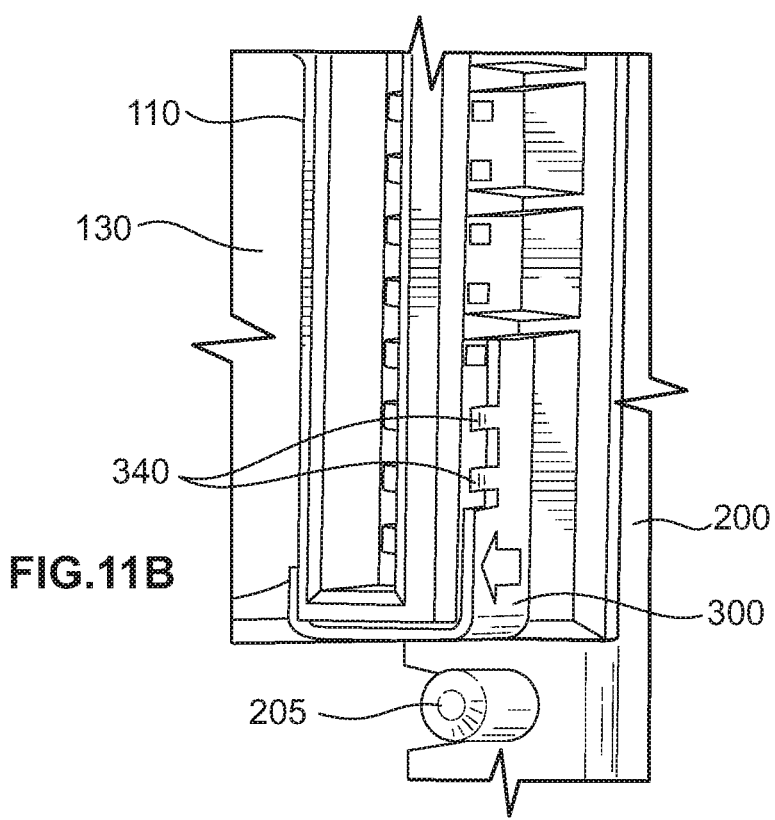
Figure 12A:
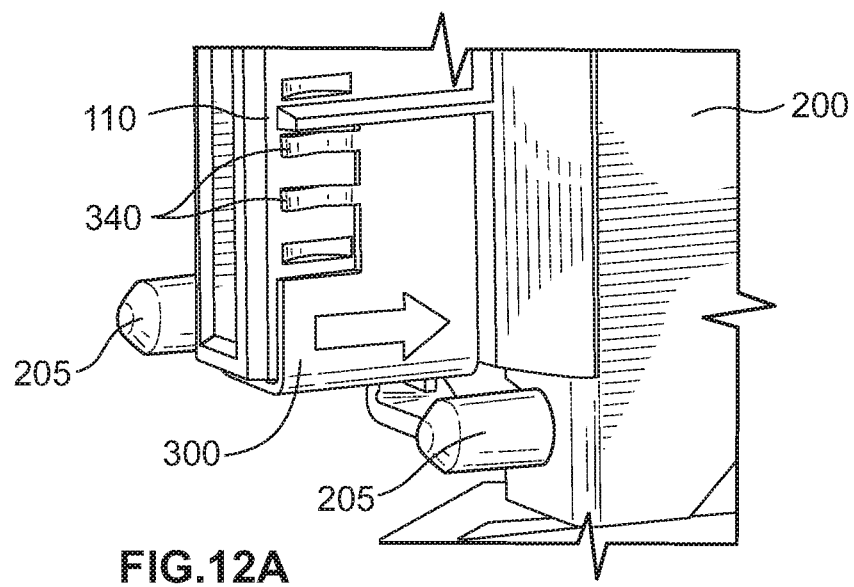
Figure 12B:
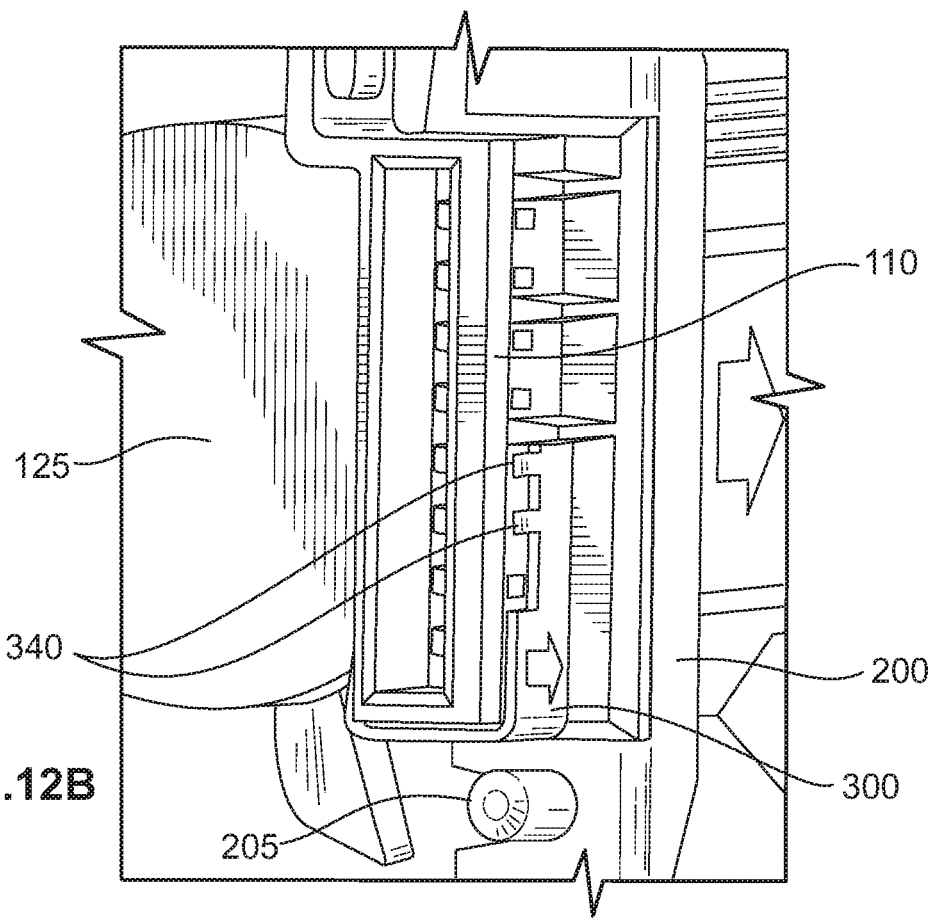
Figure 13:
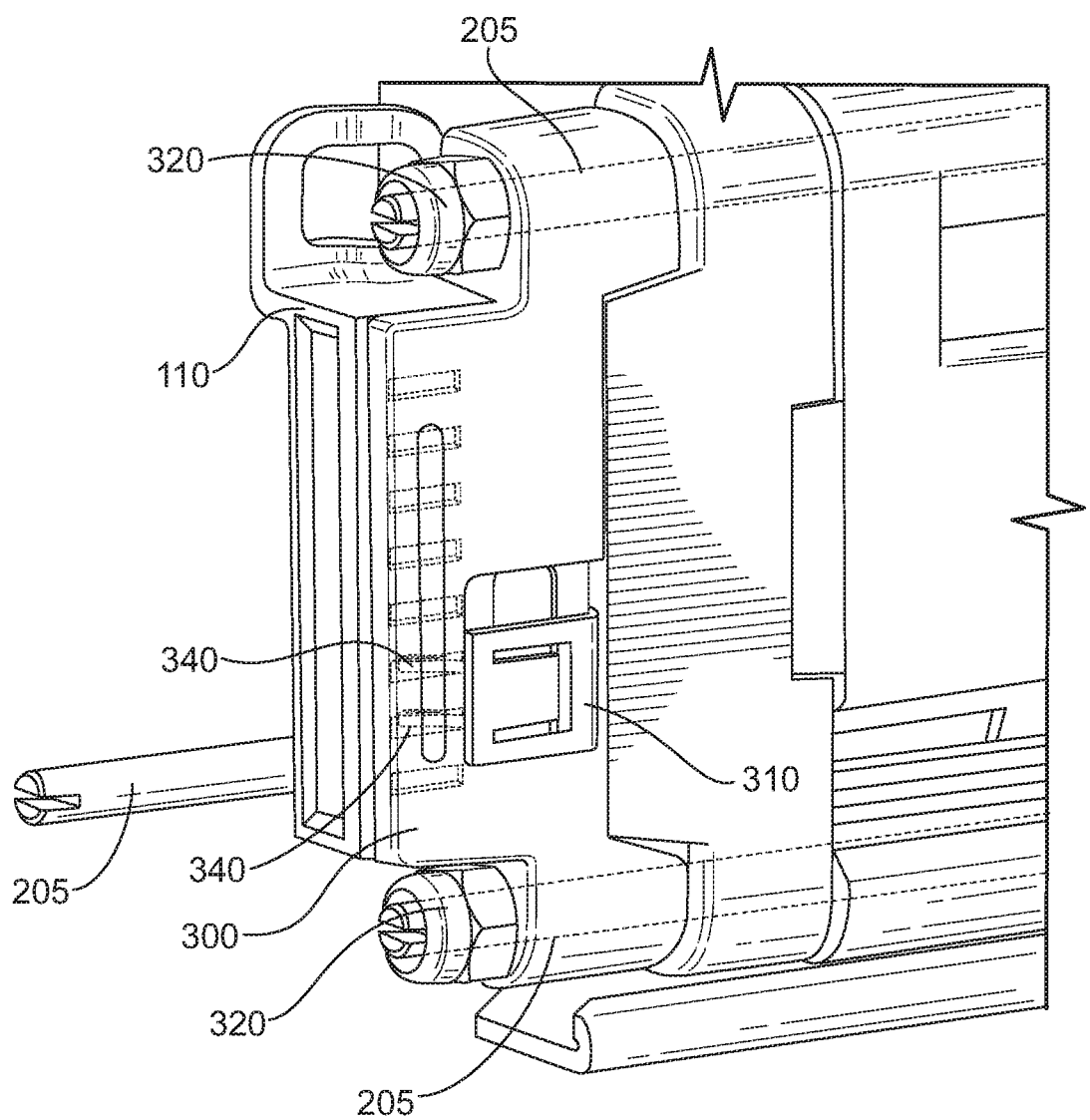
Figures 14A, 14B:
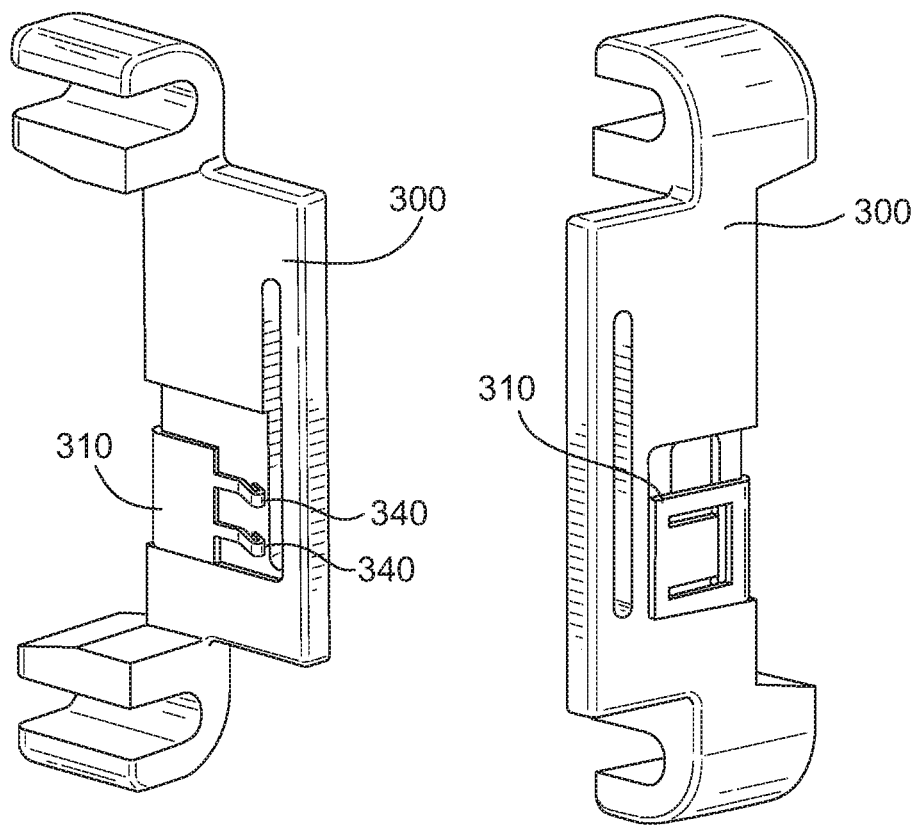
Figure 15:
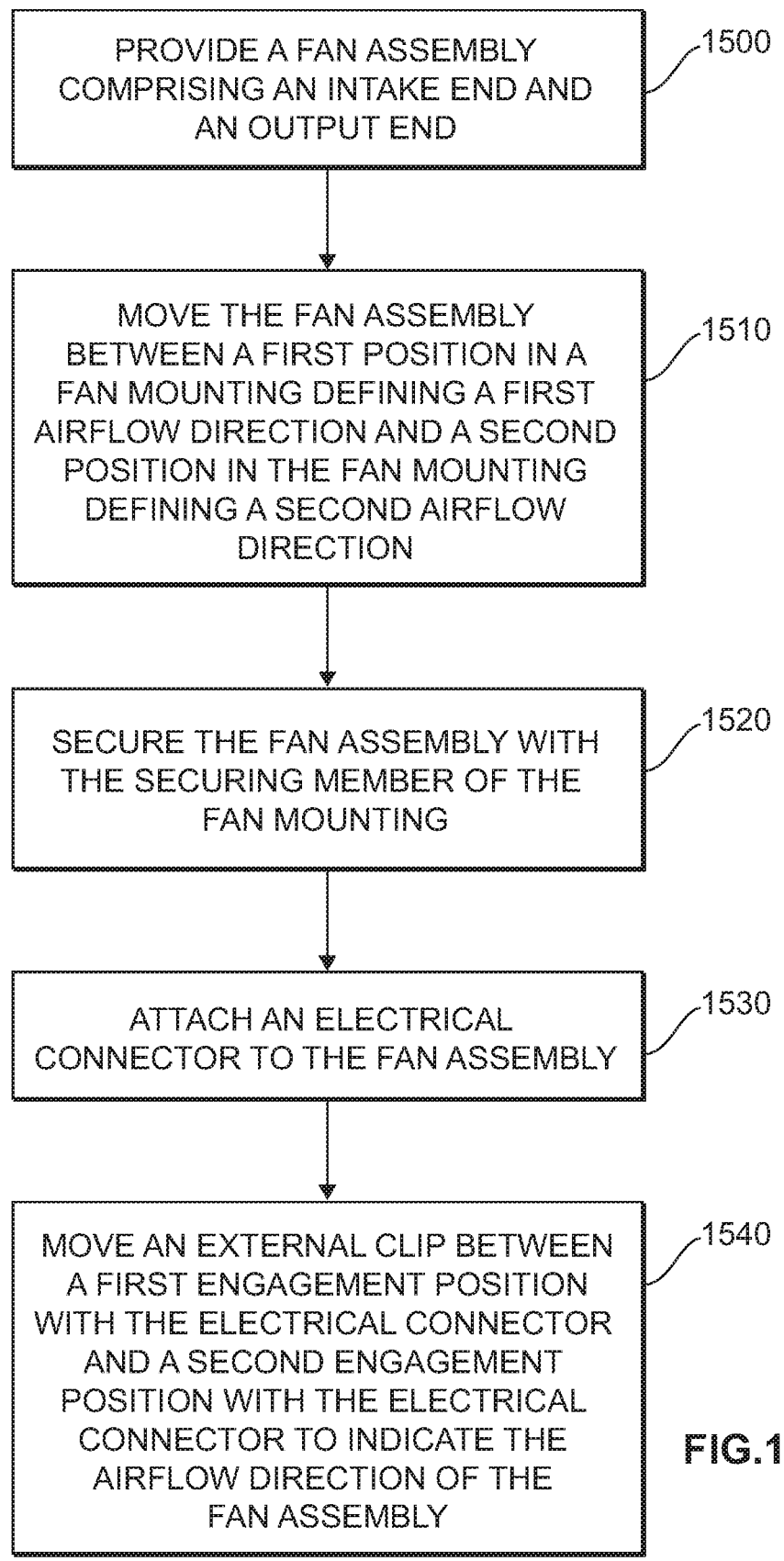

Having thus described the disclosure in general terms, reference will now be made to the accompanying drawings, which are not necessarily drawn to scale, and wherein:

FIG. 1 illustrates an example switch system box for use in a datacenter rack in accordance with an example embodiment of the present disclosure;

FIG. 2 is an exploded view of multiple universal replaceable fan units and power supplies that are configured to be received by the switch system box of FIG. 1, in accordance with an example embodiment of the present disclosure;

FIG. 3A is an interior view of the switch system box of FIG. 1 with a conventional non-universal replaceable fan unit and a universal replaceable fan unit in accordance with an example embodiment of the present disclosure installed;

FIG. 3B is a close up view of the conventional non-universal replaceable fan unit and the universal replaceable fan unit in accordance with an example embodiment shown in FIG. 3A;

FIG. 4A illustrates a fan assembly with an electrical connector attached in accordance with an example embodiment of the present disclosure, where the fan assembly is configured to provide airflow in a first direction;

FIG. 4B illustrates a fan assembly with an electrical connector attached in accordance with an example embodiment of the present disclosure, where the fan assembly is configured to provided airflow in an opposite direction to that shown in FIG. 4A;

FIGS. 5A and 5B illustrate different views of a universal replaceable fan unit in accordance with an example embodiment of the present disclosure;

FIG. 6 illustrates the universal replaceable fan unit shown in FIGS. 5A and 5B when the fan mounting is disengaged from the fan assembly in accordance with an example embodiment of the present disclosure;

FIGS. 7A and 7B illustrate different views of a universal replaceable fan unit with a fan mounting partially engaged with a fan assembly in accordance with an example embodiment of the present disclosure;

FIG. 8 illustrates the universal replaceable fan unit of FIGS. 7A and 7B with the fan mounting fully engaged with the fan assembly in accordance with another example embodiment of the present disclosure;

FIGS. 9A and 9B illustrate different views of a universal replaceable fan unit in accordance with another example embodiment of the present disclosure;

FIG. 9C illustrates the frame member of a universal replaceable fan unit in accordance with another example embodiment of the present disclosure;

FIG. 10 is a close up view of a universal replaceable fan unit, such as the one shown in FIGS. 9A and 9B, in accordance with an example embodiment of the present disclosure;

FIGS. 11A and 11B illustrate different views of an electrical connector in accordance with an example embodiment of the present disclosure when the electrical connector is attached to the output end of the fan assembly;

FIGS. 12A and 12B illustrate different views of an electrical connector in accordance with an example embodiment of the present disclosure when the electrical connector is attached to the intake end of the fan assembly;

FIG. 13 is a close-up view of a universal replaceable fan unit in accordance with another example embodiment of the present disclosure;

FIGS. 14A and 14B illustrate different views of an external clip to be used with a universal replaceable fan unit in accordance with an example embodiment of the present disclosure; and FIG. 15 is a flowchart of the operations used to reverse the airflow direction of the universal replaceable fan unit between a first airflow direction and a second airflow direction in accordance with the present disclosure.

DETAILED DESCRIPTION

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Accordingly, as an example, the term "top edge" may be used to describe an edge of a plate; however, the edge may be on the top, bottom, or side, depending on the orientation of the particular item being described. Moreover, although the example of a universal replaceable fan unit for use within a switch system is described herein and in the figures for ease of explanation, it is understood in light of this disclosure that embodiments of the universal replaceable fan unit described herein are also applicable for use in routers and other computing equipment for cooling operations.

Modern switch systems are configured with different field replaceable units (FRUs) that allow components to be quickly and easily changed out when components malfunction while the equipment is installed in an operable configuration (e.g., in the field). Additionally, some FRUs may be configured to allow for different use cases. For example, a fan unit with a first flow direction may be changed out for a fan unit with a second flow direction. In conventional systems, to do this, the replaceable fan unit must be replaced or fundamentally altered to reverse the airflow. For example, conventional systems require changing out fan assemblies to reverse the airflow or altering the internal configuration of the fan assembly. Through applied ingenuity and hard work, the inventors of the present disclosure have devised a replaceable fan unit that is configured such that it is possible to reverse the airflow direction using the same component, thereby reducing inventory requirements and facilitating equipment configuration and installation.

With reference to FIG. 1, for example, a switch system box 1000, which may house an application-specific integrated circuit (ASIC) as well as other internal components (not visible), is typically incorporated into a datacenter network via connections to other switch systems, routers, servers, and network components. The switch system box 1000 may be configured for efficient exchanging (e.g., removal and installation) of components with minimum delays to operations. A switch system box 1000 may, for example, include one or more replaceable fan units (e.g., universal replaceable fan unit 100) and one or more replaceable power supplies (e.g., power supply 10) configured to be more easily replaced without opening the switch system box 1000.

In some embodiments, one or more of the switch system boxes 1000 may be installed into a datacenter rack (not shown), such as stacked one above the other, to allow for additional processing capability. Moreover, additional components, connections, and devices may be included as part of the switch system box 1000. The switch system box 1000 may be configured to be received by a datacenter rack (not shown) and may be configured to allow for the conversion between optical signals and electrical signals. For example, optical cables may carry optical signals as inputs to the switch system boxes 1000. The optical signals may be converted to electrical signals via an opto-electronic transceiver, which may form part of the optical cable in cases in which the optical cable is an Active Optical Cable (AOC), such as a cable that includes a QSFP connector that is received by a port of the switch system box 1000. In other cases, the optical cable may be passive, and the switch system box 1000 may include separate opto-electronic components that convert between optical signals and electrical signals. The electrical signals may then be processed by the switch system box 1000 and/or routed to other computing devices, such as servers and devices on other racks or at other datacenters via other components and cables (not shown). In addition, electrical signals received from other networking devices (e.g., from other datacenters, racks, etc.) may be processed by the switch system box 1000 and then converted into corresponding optical signals to be transmitted via the optical cables.

Due to the heat created by the processing operations of the switch system box 1000, especially in datacenters were many switch system boxes 1000 are in operation in close proximity, cooling is required for the individual switch system boxes in order to maintain optimal operating conditions and minimize component failure. Replaceable fan units, such as the universal replaceable fan units 100 described herein, may be used to assist in cooling the switch system boxes 1000 and may be positioned such that the fan units may be removed and installed into the switch system boxes 1000 without opening the box.

Referring now to FIG. 2, a switch system box 1000, such as the one shown in FIG. 1, is shown with a plurality of replaceable fan units and replaceable power supplies removed. In some embodiments, the number of replaceable fan units and/or replaceable power supplies may be changed based on the size and configuration of the switch system box 1000. For example, a switch system box 1000 may need more replaceable fan units for additional cooling due to high processing related capabilities. Additionally, the fan units and/or power supplies may be replaceable, such that the fan unit and/or power supply may be replaced without requiring the switch system box 1000 to be opened or taken offline.

In order for the replaceable fan unit and/or power supply to work properly, there may be a standard size and shape of each fan unit and/or power supply. For the fan units, the direction of airflow may differ depending on the operations and needs of the switch system box 1000, such that some fan units may move air into the switch system box 1000 and some replaceable fan units may move air out of the switch system box 1000. Example embodiments of the present disclosure allow manufacturing of the replaceable fan units to be streamlined and replacement component inventory to be reduced by allowing the same components to be used regardless of the desired airflow direction. For example, the same fan assembly 120 may be used for airflow in either direction (e.g., into or out of the switch system box 1000) due to the ability to move the fan assembly from a first position to a second position.

Additionally, power supplies may have their own fan units, which may also have move air to and from the power supply. As with the fan units, providing a power supply that allows for airflow in either direction allows for more efficient manufacturing and a reduction in the number of different product models needed. In some embodiments, the power supply electrical configuration may be altered such that the fan in a power supply changes the direction of flow without physical alteration of the fan. For example, the air flow direction of the power supply may be altered by an electrical instruction, such as through an electrical circuit (e.g., Inter-Integrated Circuit (I2C) interface). In some embodiments, the blade of the fan in the power supply may be bi-directional to allow efficient cooling of the power supply in either airflow direction.

Referring now to FIG. 3A, a partially assembled switch system box 1000 is shown with a fan system motherboard 1010 configured to receive one or more fan units. As shown in more detail in FIG. 3B, the fan system motherboard 1010 is configured to receive conventional non-universal replaceable fan units (e.g., fan unit 101) and/or universal replaceable fan units 100 of example embodiments of the present disclosure. In various embodiments, the universal replaceable fan unit 100 may be configured to replace conventional non-universal fan units in addition to other universal replaceable fan units. In some embodiments, as shown in FIG. 3B, an electrical connector 110 may be installed on the end of the fan assembly 120 that is closest to the fan system motherboard 1010, such that the universal replaceable fan unit 100 may be installed in the switch system box 1000. In various embodiments, the switch system box 1000 may have various replaceable fan units, where some bring air into the switch system box 1000, while others output air from inside the switch system box 1000.

Referring now to FIGS. 4A and 4B, an attachment of an electrical connector 110 to the fan assembly 120 according to an example embodiment is shown in both the first airflow position configuration and a second airflow position configuration. Referring first to FIG. 4A, the electrical connector 110 is removably attached to the intake end 125 of the fan assembly 120, such that when installed in a switch system box 1000 or the like, the intake end 125 of the fan assembly receives air from inside the switch system box 1000 and creates a flow that takes the air outside of the switch system box 1000 at the output end 130 of the fan assembly. Alternatively, in FIG. 4B, the electrical connector 110 may be removably attached to the output end 130 of the fan assembly, such that when installed in a switch system box 1000 or the like, the output end 130 of the fan assembly introduces air into the switch system box 1000 from the outside of the switch system box 1000. In some embodiments, the same fan assembly 120 may be positioned in either the first airflow position or the second airflow position (indicated by the arrow on the fan assembly exteriors), such that the internal configuration of the fan assembly is not altered during the conversion. For example, the electrical connector 110 may be detached from the fan assembly 120 and moved to the other side (or replaced with a new electrical connector 110, see discussion relating to FIGS. 11A-12B below) without altering the fan assembly.

FIGS. 5A-9B illustrate various example embodiments in accordance with the present disclosure. In some embodiments, the universal replaceable fan unit 100 may include an electrical connector 110, a fan assembly 120, and a fan mounting, with a frame member and a securing member. In such embodiments, the fan assembly 120 may have an intake end 125 and an output end 130, and the fan mounting may be configured to allow the fan assembly to be moved between a first position defining a first airflow direction and a second position defining a second airflow direction, wherein the first airflow direction is opposite the second airflow direction. In some embodiments, the electrical connector 110 may be removably attached to the fan assembly 120 and is configured to allow electricity to be provided to the fan assembly for operation.

Referring now to FIGS. 5A, 5B, and 6, an example embodiment of a universal replaceable fan unit 100 is provided in accordance with the present disclosure. In an example embodiment, the universal replaceable fan unit 100 may include a fan assembly 120, an electrical connector 110, and a fan mounting, configured with a frame member and a securing member. In an example embodiment, the frame member may include a base plate 135 and an end plate 137. In some embodiments, the securing member may include a first clipping mechanism 150 and a second clipping mechanism 155, such that the securing member is configured to engage with the fan assembly 120 to restrict the movement of the fan assembly relative to the frame member (e.g., base plate 135 and end plate 137).

Referring to FIG. 5A, the fan mounting is shown engaged with the fan assembly 120 such that the universal replaceable fan unit 100 is a unitary piece that may be installed in a switch system box 1000. In some embodiments, the base plate 135 may be configured to cover a long side of the fan assembly 120, as shown. In some embodiments, the end plate 137 may be configured to be positioned at the end of the fan assembly 120 opposite the electrical connector 110. In some embodiments, the base plate 135 and the end plate 137 may be attached to each other, such that the frame mounting is one piece. In some embodiments, a locking mechanism 185 is provided to lock the universal replaceable fan unit 100 into an operating position, such as within a switch system box 1000. In some embodiments, a handle 190 may be provided on the end plate 137, such that the universal replaceable fan unit 100 may be installed and removed from a switch system box 1000 by a user pulling or pushing on the handle. For example, the end plate 137 may fit flush with the exterior wall of the switch system box 1000, and the handle 190 may extend beyond the exterior wall of the switch system box 1000 so as to be accessible to a user. As such, the universal replaceable fan unit 100 may be configured to replace existing replaceable fan units of different sizes and shapes (e.g., a given universal replaceable fan unit 100 may have the same outer dimensions as a non-universal replaceable fan unit that the universal replaceable fan unit is to replace).

In some embodiments, the first clip attachment end 160 of the first clipping mechanism 150 may be attached to a first edge of the frame member (e.g., a top edge of the base plate 135 as shown in the figures). In some embodiments, the second clip attachment end 170 of the second clipping mechanism 155 may be attached to a second edge of the frame member (e.g., a bottom edge of the base plate 135) opposite the first edge. In some embodiments, the first clipping mechanism 150 and/or the second clipping mechanism 155 may be hingedly attached to the frame member (e.g., the base plate 135), such that the respective first clipping mechanism 150 and/or the second clipping mechanism 155 may rotate about the respective attachment edge (e.g., the first or second edge) of the frame member (e.g., the base plate 135). In some embodiments, the first clipping mechanism 150 may include one or more side clips 180 configured along an edge of the first clipping mechanism 150 between the first clip attachment end 160 and the first clip engaging end 165. In some embodiments, the second clipping mechanism 155 may include one or more side clips 180 configured along an edge of the second clipping mechanism 155 between the second clip attachment end 170 and the second clip engaging end 175. The side clip(s) 180 of the first clipping mechanism 150 and/or the second clipping mechanism 155 may be configured to engage one or more recesses on the intake end 125 or the output end 130 of the fan assembly 120, depending on the airflow direction.

Referring now to FIG. 5B, another view of the fan mounting attached to the fan assembly 120 is shown, in which the universal replaceable fan unit 100 is a unitary piece that may be installed into a switch system box 1000. In some embodiments, the first clipping mechanism 150 may be configured to engage with the fan assembly 120 at the first clip engaging end 165 of the first clipping mechanism 150. In some embodiments, the first clip engaging end 165 may have a plurality of engagement points (e.g., where the first clipping mechanism 150 is received by a recess in the fan assembly 120). In some embodiments, the fan assembly 120 may have multiple recesses configured such that the first clipping mechanism 150 and/or the second clipping mechanism 155 may engage the fan assembly in both the first position and the second position of the fan assembly 120 (e.g., the fan assembly may be symmetrical). In some embodiments, the first clipping mechanism 150 may have one or more clipping mechanism side clips 180 configured along an edge of the first clipping mechanism between the first clip attachment end 160 and the first clip engaging end 165. In some embodiments, the clipping mechanism side clips 180 may be removably engaged with a recess on the fan assembly 120, such as a through hole 210A.

In some embodiments, the second clipping mechanism 155 may be configured to engage with the fan assembly 120 at the second clip engaging end 175 of the second clipping mechanism 155. In some embodiments, the second clip engaging end 175 may have a plurality of engagement points (e.g., where the second clipping mechanism 155 is received by a corresponding recess in the fan assembly 120). In some embodiments, the second clipping mechanism 155 may have one or more clipping mechanism side clips 180 disposed along an edge of the second clipping mechanism between the second clip attachment end 170 and the second clip engaging end 175. In some embodiments, the clipping mechanism side clips 180 may be removably engaged with a recess on the fan assembly 120, such as a through hole 210B.

Referring now to FIG. 6, the fan mounting is shown disengaged from the fan assembly in accordance with embodiments of the present invention. In some embodiments, the first clipping mechanism 150 may be hingedly attached to the base plate 135, such that the first clipping mechanism may rotate about the first edge of the base plate (e.g., the top edge). In some embodiments, the second clipping mechanism 155 may be hingedly attached to the base plate 135, such that the second clipping mechanism may rotate about the second edge of the base plate (e.g., bottom edge). In some embodiments, the clipping mechanisms 150, 155 may have sufficient engagement with the fan assembly 120 that the movement of the clipping mechanisms 150, 155, once engaged, is limited (e.g., the clipping mechanisms must be manually released from engagement by a user). In some embodiments, the first clipping mechanism 150 and/or the second clipping mechanism 155 may be rigidly attached to the base plate 135 at a respective attachment edge (e.g., the first edge for the first clipping mechanism and/or the second edge for the second clipping mechanism) and may be configured to be sufficiently flexible to engage and disengage with the fan assembly 120.

In some embodiments, in an instance in which the fan mounting is disengaged from the fan assembly 120, the fan assembly 120 may be rotated from one position of airflow to another. In such an embodiment, the electrical connector 110 may be removed from either the intake end 125 or the output end 130 of the fan assembly and an electrical connector 110 may be installed at the opposite end of the fan assembly. In some embodiments, the fan assembly 120 may be configured to receive the first clip engaging end 165 of the first clipping mechanism 150 and the second clip engaging end 175 of the second clipping mechanism 155 whether in the first airflow position or the second airflow position. For example, the fan assembly may have symmetrical recesses configured to receive the clipping mechanisms 150, 155 at each position of the fan assembly. In some embodiments, the clipping mechanisms 150, 155 may be configured to engage with existing recesses on the fan assembly 120 (e.g., recesses on a conventional fan assembly 120). Additionally or alternatively, the fan assembly 120 may be configured with additional recesses based on the configuration of the clipping mechanism 150, 155. In some embodiments, the first clipping mechanism 150 and the second clipping mechanism 155 may be removably engaged with the fan assembly 120, such that when not engaged, the fan assembly 120 may be rotated from one airflow direction to another airflow direction in the opposite direction. In some embodiments, the clipping mechanisms 150, 155 allow for the fan assembly 120 to be rotated without the need for tools or the like.

Referring now to FIGS. 7, 8A, and 8B, another example embodiment is shown of a universal replaceable fan unit in accordance with the present disclosure. In an example embodiment, the universal replaceable fan unit 100 may include an electrical connector 110, a fan assembly 120, and a fan mounting, configured with a frame member and a securing member. In an example embodiment, the frame member may include a base plate 135 and an end plate 137. In some embodiments, the base plate 135 and the end plate 137 may be attached to one another. In some embodiments, the securing member may include a first clipping mechanism 150 and a second clipping mechanism 155, such that the securing member is configured to engage with the fan assembly 120 to restrict the movement of the fan assembly relative to the frame member (e.g., base plate 135 and end plate 137).

Referring now to FIG. 7A, an exterior view of the universal replaceable fan unit 100 is shown when the fan mounting is partially engaged with the fan assembly 120. In an example embodiment, the base plate 135 of the frame member may be configured to cover part, but not all, of one side of the fan assembly 120. In some embodiments, the end plate 137 may be positioned along the end of the fan assembly 120 opposite the electrical connector 110. In some embodiments, the first clip attachment end 160 of the first clipping mechanism 150 may be attached to the frame member at a first edge (e.g., an edge of the base plate 135), such that the first clipping mechanism 150 may be removably engaged with the fan assembly. For example, the first clipping mechanism 150 may be configured to flexibly engage the fan assembly 120 at a first clip engaging end 165. In some embodiments, the first clip engaging end 165 may engage with one or more recesses in the fan assembly 120, such as one or more through holes used for screws in conventional installations, via a friction fit. In some embodiments, the first clipping mechanism 150 may be the same piece of material that forms the base plate 135, such that one end of the base plate 135 may flexibly engage with the fan assembly 120.

In some embodiments, a locking mechanism 185 is provided to lock the universal replaceable fan unit 100 into place, such as in a switch system box 1000. In some embodiments, a handle 190 may be provided on the end plate 137, such that the universal replaceable fan unit 100 may be installed and removed from a switch system box 1000 by a user pulling or pushing on the handle. For example, the end plate 137 may fit flush with the exterior wall of the switch system box 1000, and the handle 190 may extend beyond the exterior wall, so as to be accessible to a user.

As shown more clearly in FIG. 7B, the second clip attachment end 170 of the second clipping mechanism 155 may be attached to a second edge of the frame member (e.g., an edge of the end plate 137). In some embodiments, the second edge of the frame member may be an edge of the end plate 137 opposite the first edge of the frame member, which may be an edge of the base plate 135. In some embodiments, the second clip attachment end 170 may be hingedly attached to the end plate 137, such that the second clipping mechanism 155 may rotate about the edge of the end plate. In some embodiments, the second clip engaging end 175 of the second clipping mechanism 155 may be engaged with one or more recesses (e.g., through holes) on the end of the fan assembly 120 on which the electrical connector 110 is installed (i.e., the side of the fan assembly opposite the end plate 137).

Referring now to FIG. 8, the universal replaceable fan unit 100 of an example embodiment is shown with the clipping mechanisms 150, 155 engaged. In such an embodiment, the clipping mechanisms 150, 155 may resist the movement of the fan assembly 120 relative to the frame member (e.g., the base plate 135 and the end plate 137), such that the universal replaceable fan unit 100 may be carried and/or moved as one unitary piece (e.g., for installation in a switch system box 1000). In some embodiments, the unitary universal replaceable fan unit 100 may be the same as, or similar in size and shape to, a conventional non-universal replaceable fan unit (e.g., fan unit 101 shown in FIG. 3B), such that the unitary replaceable fan unit 100 may be used as a replacement unit for a conventional non-universal replaceable fan unit.

Referring now to FIGS. 9A, 9B, and 10, another example embodiment is shown of a universal replaceable fan unit 100 in accordance with the present disclosure. In an example embodiment, the universal replaceable fan unit 100 may include a fan assembly 120, an electrical connector 110, and a fan mounting, configured with a frame member and a securing member. In an example embodiment, the frame member may include an end plate 137 and a plurality of pins 205 attached to the end plate. In some embodiments, the fan mounting may also include a base plate 135 running along the fan assembly 120. In some embodiments, the securing member may include one or more securing plates 200 configured to engaged with one or more of the plurality of pins 205, such that the movement of the fan assembly 120 is restricted in at least one direction (e.g., away from the end plate 137) with respect to the fan mounting.

In some embodiments, one or more of the pin(s) 205 may be a bolt, and the securing member may comprise one or more nuts 320. Each bolt may be configured to receive a nut 320. In some embodiments, as shown in FIG. 13, the pin(s) may be threaded (e.g., bolts) with nut(s) 320 coupled via the threading. For example, the pin(s) 205 may be a bolt with threading configured to secure a nut 320. In some embodiments, one or more nuts 320 may be press-fit to the pin(s) 205. In some embodiments, the securing member may include one or more nuts 320 and one or more securing plates 200. For example, one or more pins may be secured using a securing plate 200 as described herein, while one or more other pins 205 may be secured by a nut 320.

Referring now to FIGS. 9A and 9B, the fan assembly 120 may have two or more fastening channels 210 (e.g., through holes used for screws in conventional installations), each fastening channel 210 configured to receive a pin 205. In some embodiments, a pin 205 may be longer than the corresponding fastening channel 210. In some embodiments, the pins 205 may be configured to removably engage with a securing plate 200 on the opposite side of the fan assembly 120 from the end plate 137, such that movement of the fan assembly is restricted to between the end plate 137 and the securing plate(s) 200. In some embodiments, the pins 205 may have one or more notches 220 (shown in FIG. 10) configured to receive the securing plate 200 (e.g., to receive the securing holes 215 of the securing plate 200). In some embodiments, the securing plate(s) 200 may be configured to engage with at least one of the pin 205 via a friction fit. In some embodiments, the securing holes may have a smaller diameter than the pin 205, such that in an instance in which the securing holes are received by the notches of the pin 205 and the fan assembly 120 provides a force against the securing plate 200, a counter force is applied by the pin against the securing plate 200 restricting the movement of the fan assembly away from the end plate 137. Additionally, in some embodiments the base plate 135 and/or the end plate 137 may be configured to block or minimize Electromagnetic Interference (EMI) and/or Electrostatic Discharge (ESD). In some embodiments, the base plate 135 and/or end plate 137 may be configured with the locking mechanism 185 and/or the handle 190 for the universal replaceable fan unit 100. In some embodiments, where the pins do not have any notches, the securing hole in the securing plate(s) may be slightly smaller than the diameter of the pin 205, such that the edges of the securing hole cling to the pin when installed and produce a counter force to any potential force from the fan assembly movement. As discussed above, in some embodiments, the one or more pins 205 may be configured to receive a nut 320 as a securing member.

Referring now to FIG. 9C, a frame member of an example embodiment is shown without a fan assembly installed. As shown, in some embodiments, the frame member may have a base plate 135, an end plate 137, and one or more pins 205 (e.g., 3 pins). In some embodiments, as shown, the one or more pins 205 may be received by a hole in the end plate 137. In some embodiments, the end plate 137 may be configured with vent holes to allow the air to flow either into or out of the fan assembly, depending on the airflow direction. In some embodiments, as shown, one or more pins 205 may be received within the handle 190.

Referring now to FIG. 11A-13, various configurations of the electrical connector 110 are shown in accordance with an example embodiment. In some embodiments, the electrical connector 110 may have one configuration to indicate to the fan system motherboard 1010 that the universal replaceable fan unit 100 is configured to provide airflow in a first direction and another configuration to indicate to the fan system motherboard 1010 that the universal replaceable fan unit 100 is configured to provide airflow in a second direction. For example, the electrical connector 110 may have an 8-pin connector, and different pins of the 8-pin connector may be shorted out based on the desired airflow direction of the universal replaceable fan unit 100. Various types of electrical connectors 110 may be used with the universal replaceable fan unit 100 based on the type of fan assembly and/or type of electrical connector port provided by the fan system motherboard 1010. FIGS. 11A and 11B illustrate the electrical connector 110 in accordance with an example embodiment with the electrical connector 110 attached at the output end 130 of the fan assembly 120. In some such embodiments, an external clip 300 may be configured to short one or more pins of the electrical connector 110 (e.g., making an electrical connection to either a "high" or "low" logicvoltage level). In an example embodiment, the electrical connector 110 may have clearance apertures that allow connection to the leaf springs inside, and the external clip 300 may have finger(s) 340 configured to ingress through one or more of the clearance apertures so as to short the selected pins of the electrical connector 110. In the configuration of FIGS. 11A and 11B, the universal replaceable fan unit 100 may be configured to introduce airflow into the switch system box 1000 or the like. FIGS. 12A and 12B illustrate the electrical connector 110 configuration when attached to the intake end 125 of the fan assembly, such that when installed in a switch system box 1000, the fan will be removing air from the switch system box 1000 to the exterior.

Referring now to FIG. 13, an additional embodiment of the electrical connector 110 with the external clip 300 is shown in accordance with an example embodiment. In some embodiments, the external clip 300 may be configured to switch from a first engagement position to a second engagement position in order to short one or more pins of the electrical connector 110 to indicate the airflow direction of the universal replaceable fan unit 100. For example, as shown in FIG. 13, the external clip 300 may have the slideable insert 310 positioned to short two pins of the electrical connector 110 to indicate that the universal replaceable fan unit is inputting air into the switch system box 1000, while in an instance in which the universal replaceable fan unit is reversed, the slideable insert 310 may be moved upward to a second position that shorts at least one other pin of the electrical connector 110. In some embodiments, the external clip 300 may be configured such that at one position indicating a first airflow direction, the voltage is higher than in a second position indicating a second airflow direction or vice versa.

In some embodiments, the switch system box 1000 or the like may be configured to determine whether the airflow direction of the universal replaceable fan unit 100 is the same as a recommended and/or desired airflow direction. For example, in an instance in which the airflow direction does not match the recommended airflow direction, the switch system box 1000 may provide an error message. As shown in FIG. 13, in some embodiments the external clip 300 may be configured to be held in place relative to the electrical connector 110 by one or more of the pins 205. In some embodiments, the pins 205 may be threaded (e.g., the pin may be a bolt), such that a nut 320 may be used to secure the fan assembly 120, the electrical connector 110, and/or the external clip 300. In some embodiments, the nut 320 may be a lock nut. For example, the nut 320 may be a prevailing torque hex lock nut with nylon insert. In various embodiments, other nut types may be used.

Referring now to FIGS. 14A and 14B, multiple views of an external clip 300 according to an example embodiment is shown. The external clip 300 shown in FIGS. 14A and 14B may have one or more fingers 340 configured to engage with the electrical connector 110 to indicate the airflow direction of the fan assembly 120. In some embodiments, the external clip 300 may have a slideable insert 310 that includes the one or more fingers 340. In some embodiments, the slideable insert 310 may be moved from a first engagement position indicating a first airflow direction and a second engagement position indicating a second airflow direction. The indication of the airflow direction may be based on a change in voltage.

FIG. 15 illustrates a flowchart of the operations used to change the airflow direction of the universal replaceable fan unit between a first airflow direction and a second airflow direction in accordance with example embodiments of the present disclosure. Unless otherwise noted, the operations described may be accomplished using various embodiments described herein.

Referring now to Block 1500 of FIG. 15, the method includes providing a fan assembly 120 comprising an intake end 125 and an output end 130. In some embodiments, the fan assembly 120 may be a standard fan assembly. For example, a switch system box 1000 may be configured (e.g., sized and shaped) to receive and operate with a fan assembly having a specific size currently, and that fan assembly size may also be provided by the universal replaceable fan unit 100, such that embodiments of the universal replaceable fan unit of the present invention may be used in conventional switch system boxes. In some embodiments, the dimensions of the universal replaceable fan unit may be based on the size of an opening to receive a replaceable fan unit in a switch system box 1000 or the like. For example, embodiments of the same fan assembly 120 may be in conventional switch system boxes, such that the universal replaceable fan unit 100 may replace a conventional non-universal replaceable fan unit.

Referring now to Block 1510 of FIG. 15, the method includes moving the fan assembly 120 between a first position and a second position. In such an embodiment, the first position may define a first airflow direction and the second position may define a second airflow direction, opposite the first airflow direction. For example, the first position of the fan assembly 120 may be when the electrical connector 110 is attached to the intake end 125 of the fan assembly, such that when installed in a switch system box 1000, the first airflow direction of the universal replaceable fan unit 100 may be defined as intaking air from the inside the switch system box 1000 and outputting said air outside of the switch system box 1000. Alternatively, the second position of the fan assembly 120 may be when the electrical connector 110 is attached to the output end 130 of the fan assembly, such that when installed in a switch system box 1000, the second airflow direction of the universal fan assembly 120 may be defined as intaking air from outside of the switch system box 1000 and outputting said air into the switch system box 1000. In various embodiments, the moving of the fan assembly 120 may be completed in accordance with an example embodiment described herein.

As discussed herein relating to various embodiments, the universal replaceable fan unit 100 may be configured to allow the fan assembly to be moved from a first position to a second position and subsequently secured to the fan mounting after the fan assembly has been moved. In some embodiments, the universal replaceable fan unit 100 may include securing member(s) (e.g., the first and second clipping mechanisms 150, 155 or securing plate 200) configured to removably engage with the fan assembly 120, such that the fan assembly 120 may be rotated between the first position and second position, or vice versa, and the securing members may then engage with the fan assembly 120 restricting the fan assembly 120 movement relative to the fan mounting as discussed in reference to Block 1520 below.

Referring now to Block 1520 of FIG. 15, the method may include securing the fan assembly 120 with the securing member of the fan mounting. In some embodiments, the securing member may be configured to restrict the motion of the fan assembly 120 with respect to the fan mounting in at least one direction. As discussed throughout, the securing member may be configured differently based on the example embodiment. For example, in some embodiments, the securing member may include a first and second clipping mechanism 150, 155, and in other example embodiments, the securing member may include one or more securing plates 200 and/or nuts 320.

Referring now to Block 1530 of FIG. 15, the method may include attaching an electrical connector 110 to the fan assembly 120. As discussed in more detail herein, such as in reference to FIGS. 11A-13, the electrical connector 110 may be electrically configured based on the end of the fan assembly 120 to which the electrical connector is attached.

Referring now to Block 1540 of FIG. 15, the method may include moving an external clip 300 between a first engagement position with the electrical connector 110 and a second engagement position with the electrical connector to indicate the airflow direction of the fan assembly 120. Different external clips 300 may be used in various embodiments (e.g., the external clip 300 shown in FIGS. 12A and 13). As discussed above in reference to FIGS. 11A-14, the external clip 300 of an example embodiment may be configured to engage with the electrical connector 110 (e.g., via finger 340) to indicate to the switch system box 1000, router, or the like, the airflow direction of the fan assembly 120. In some embodiments, different external clips may be used for each airflow direction (e.g., such as shown in FIGS. 11A-12B) or the same external clip 300 may be used, where the fingers 340 of the external clip may be moved from a first engagement position to a second engagement position. In some embodiments, the first engagement position and the second engagement position may indicate different airflow directions by having different logic voltage levels (e.g., one of the engagement positions may have a higher voltage than the other engagement position). In various embodiments, the voltage difference between the logic voltage levels of the two engagement positions may vary based on the configuration of the switch system box 1000, router, or the like (e.g., operating voltage). For example, the difference between the logic voltage levels of the two engagement positions may be 3 volts in an example embodiment.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components (e.g., components of the respective printed circuit boards, FRUs, transceivers, cables, etc.) may also be part of the switch system box or router. In addition, although the examples provided above primarily describe a universal replaceable fan unit for use in a main networking (e.g., switch or router) box, it is understood that the universal replaceable fan unit described herein may be used in other processing environments. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in FIG. 13, and in some cases one or more of the steps depicted may occur substantially simultaneously. Although specific terms are employed herein, they are used in a generic and descriptive sense only and not for purposes of limitation.

What is claimed is:

1. A universal replaceable fan unit comprising:
    a fan assembly comprising an intake end and an output end, wherein the fan assembly is configured to create an airflow from the intake end to the output end, the fan assembly comprising a plurality of fastening channels;
    a fan mounting configured to receive and secure the fan assembly in an operable position, the fan mounting comprising:
        a frame member comprising an end plate and a plurality of pins attached to the end plate at one end of each respective pin, wherein, in the operable position, each of the plurality of pins are configured to be received by the plurality of fastening channels; and
        a securing member,
    wherein the fan mounting is configured to allow the fan assembly to be moved with respect to the fan mounting between a first position defining a first airflow direction and a second position defining a second airflow direction, wherein the first airflow direction is opposite the second airflow direction; and
    an electrical connector removably attached to the fan assembly, wherein the electrical connector is configured to allow electricity to be provided to the fan assembly for operation.

2. The universal replaceable fan unit of claim 1, wherein the frame member defines a first edge and a second edge; and
    the securing member comprises a first clipping mechanism and a second clipping mechanism, wherein the first clipping mechanism is attached at a first clip attachment end to the first edge of the frame member and the second clipping mechanism is attached at a second clip attachment end to the second edge of the frame member,
    wherein the first clipping mechanism is engagable with a first recess of the fan assembly at a first clip engaging end and the second clipping mechanism is engagable with a second recess of the fan assembly at a second clip engaging end, such that the fan assembly is removably attached to the frame member in an instance in which the first clipping mechanism is engaged with the first recess and the second clipping mechanism is engaged with the second recess.

3. The universal replaceable fan unit of claim 2, wherein the frame member comprises a base plate, wherein the first edge of the frame member is an edge of the base plate and the second edge of the frame member is an edge of the base plate opposite the first edge.

4. The universal replaceable fan unit of claim 2, wherein the frame member further comprises a base plate, wherein the first edge of the frame member is an edge of the base plate and the second edge of the frame member is an edge of the end plate.

5. The universal replaceable fan unit of claim 2, wherein at least one of the first clipping mechanism or the second clipping mechanism is hingedly attached to the frame member.

6. The universal replaceable fan unit of claim 1, wherein the securing member comprises one or more nuts, and the plurality of pins are configured to removably engage with the plurality of fastening channels and with the one or more nuts.

7. The universal replaceable fan unit of claim 6, wherein the one or more nuts are configured to restrict movement of the fan assembly with respect to the fan mounting when the plurality of pins are engaged with the plurality of fastening channels.

8. The universal replaceable fan unit of claim 1, wherein the securing member comprises one or more securing plates, and the plurality of pins are configured to removably engage with the plurality of fastening channels and with the one or more securing plates.

9. The universal replaceable fan unit of claim 1, wherein the fan mounting further comprises a handle at an exterior end of the fan mounting, such that the universal replaceable fan unit can be removed from a switch system box via the handle.

10. The universal replaceable fan unit of claim 1, wherein the securing member is configured to restrict the movement of the fan assembly with respect to the fan mounting when engaged with the fan assembly.

11. A method of reversing an airflow direction of a universal replaceable fan unit, the method comprising:
provided a fan assembly comprising an intake end and an output end, wherein the fan assembly is configured to create an airflow from the intake end to the output end, the fan assembly comprising a plurality of fastening channels;
moving the fan assembly between a first position in a fan mounting defining a first airflow direction and a second position in the fan mounting defining a second airflow direction, wherein the first airflow direction is opposite the second airflow direction, wherein the fan mounting comprises a frame member and a securing member, the frame member comprising an end plate and a plurality of pins attached to the end plate at one end of each respective pin, wherein each of the plurality of pins are configured to be received by the plurality of fastening channels;
securing the fan assembly to the fan mounting via the securing member; and
attaching an electrical connector to the fan assembly, wherein the electrical connector is configured to allow electricity to be provided to the fan assembly for operation.

12. The method of claim 11, wherein the frame member comprises a first edge and a second edge, and the securing member comprises a first clipping mechanism and a second clipping mechanism, wherein the first clipping mechanism is attached at a first clip attachment end to the first edge of the frame member and the second clipping mechanism is attached at a second clip attachment end to the second edge of the frame member, wherein the method further comprises:
engaging the first clipping mechanism with a first recess of the fan assembly at a first clip engaging end; and
engaging the second clipping mechanism with a second recess of the fan assembly at a second clip engaging end, such that the fan assembly is removably attached to the frame member in an instance in which the first clipping mechanism is engaged with the first recess and the second clipping mechanism is engaged with the second recess.

13. The method of claim 12, wherein the frame member comprises a base plate, wherein the first edge of the frame member is an edge of the base plate and the second edge of the frame member is an edge of the base plate opposite the first edge.

14. The method of claim 12, wherein the frame member further comprises a base plate, wherein the first edge of the frame member is an edge of the base plate and the second edge of the frame member is an edge of the end plate.

15. The method of claim 12, wherein at least one of the first clipping mechanism or the second clipping mechanism is hingedly attached to the frame member.

16. The method of claim 11, wherein the securing member comprises one or more nuts, wherein the method further comprises:
engaging the plurality of pins with the plurality of fastening channels; and
engaging the plurality of pins with the one or more nuts.

17. The method of claim 16, wherein the one or more nuts are configured to restrict movement of the fan assembly with respect to the fan mounting when the plurality of pins are engaged with the plurality of fastening channels.

18. The method of claim 11, wherein the securing member comprises one or more securing plates, wherein the method further comprises:
engaging the plurality of pins with the plurality of fastening channels; and
engaging the plurality of pins with the one or more securing plates.

19. The method of claim 11, wherein the fan mounting further comprises a handle at an exterior end of the fan mounting, such that the universal replaceable fan unit can be removed from a switch system box via the handle.

20. The method of claim 11, wherein the securing member is configured to restrict the movement of the fan assembly with respect to the fan mounting when engaged with the fan assembly.

* * * * *